(12) United States Patent
Slachter et al.

(10) Patent No.: US 12,044,980 B2
(45) Date of Patent: Jul. 23, 2024

(54) METHOD OF MANUFACTURING DEVICES

(71) Applicant: ASML NETHERLANDS B.V., Veldhoven (NL)

(72) Inventors: Abraham Slachter, Waalre (NL); Wim Tjibbo Tel, Helmond (NL); Daan Maurits Slotboom, Wolphaartsdijk (NL); Vadim Yourievich Timoshkov, Veldhoven (NL); Koen Wilhelmus Cornelis Adrianus Van Der Straten, Oud Gastel (NL); Boris Menchtchikov, Redwood City, CA (US); Simon Philip Spencer Hastings, San Jose, CA (US); Cyrus Emil Tabery, San Jose, CA (US); Maxime Philippe Frederic Genin, San Mateo, CA (US); Youping Zhang, Cupertino, CA (US); Yi Zou, Foster City, CA (US); Chenxi Lin, Newark, CA (US); Yana Cheng, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 459 days.

(21) Appl. No.: 17/296,316

(22) PCT Filed: Oct. 30, 2019

(86) PCT No.: PCT/EP2019/079640
§ 371 (c)(1),
(2) Date: May 24, 2021

(87) PCT Pub. No.: WO2020/114684
PCT Pub. Date: Jun. 11, 2020

(65) Prior Publication Data
US 2021/0397172 A1  Dec. 23, 2021

Related U.S. Application Data

(60) Provisional application No. 62/774,480, filed on Dec. 3, 2018, provisional application No. 62/814,544, filed on Mar. 6, 2019.

(51) Int. Cl.
*G05B 19/418* (2006.01)
*G03F 7/00* (2006.01)

(52) U.S. Cl.
CPC ...... *G03F 7/70625* (2013.01); *G03F 7/70616* (2013.01); *G05B 19/4188* (2013.01); *G03F 7/70525* (2013.01)

(58) Field of Classification Search
CPC ............. G05B 19/4188; G03F 7/70616; G03F 7/70625; G03F 7/70525; G01B 11/30; G01B 11/272; G06F 30/39; G06F 2119/18
See application file for complete search history.

(56) References Cited

U.S. PATENT DOCUMENTS 6,757,579 B1 * 6/2004 Pasadyn ................. G05B 13/04
700/52
6,952,253 B2 10/2005 Lof et al.
(Continued)

FOREIGN PATENT DOCUMENTS

EP  1628164  2/2006
WO  2011012624  2/2011
(Continued)

OTHER PUBLICATIONS

Jochemsen et al "Metrology Method for Process Window Definition", Apr. 6, 2017, WO2017055086-A1 (Year: 2017 ).*
(Continued)

*Primary Examiner* — Sang H Nguyen
(74) *Attorney, Agent, or Firm* — Pillsbury Winthrop Shaw Pittman, LLP

(57) ABSTRACT

A method for analyzing a process, the method including obtaining a multi-dimensional probability density function representing an expected distribution of values for a plurality of process parameters; obtaining a performance function relating values of the process parameters to a performance metric of the process; and using the performance function to map the probability density function to a performance probability function having the process parameters as arguments.

20 Claims, 17 Drawing Sheets

(56) References Cited

U.S. PATENT DOCUMENTS

| | | | |
|---|---|---|---|
| 8,856,698 B1 | 10/2014 | Latypov | |
| 2007/0099100 A1* | 5/2007 | Finders | G03F 7/70333 430/30 |
| 2007/0296960 A1 | 12/2007 | Den Boef et al. | |
| 2008/0198380 A1 | 8/2008 | Straaijer et al. | |
| 2008/0270088 A1 | 10/2008 | Abe et al. | |
| 2009/0168062 A1 | 7/2009 | Straaijer | |
| 2010/0007863 A1 | 1/2010 | Jordanoska | |
| 2010/0162197 A1* | 6/2010 | Ye | G06F 30/398 716/53 |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2012/0044470 A1 | 2/2012 | Smilde et al. | |
| 2012/0044495 A1 | 2/2012 | Straaijer | |
| 2012/0117522 A1* | 5/2012 | Feng | G06F 30/20 716/54 |
| 2012/0123748 A1* | 5/2012 | Aben | G03F 7/705 703/2 |
| 2013/0162996 A1 | 6/2013 | Straaijer et al. | |
| 2013/0308142 A1 | 11/2013 | Straaijer | |
| 2014/0282307 A1* | 9/2014 | Latypov | G06F 30/39 716/56 |
| 2014/0358478 A1 | 12/2014 | Yu et al. | |
| 2016/0161863 A1 | 6/2016 | Den Boef et al. | |
| 2016/0313653 A1* | 10/2016 | Mink | G03F 7/70633 |
| 2016/0325504 A1* | 11/2016 | Mossavat | B29C 64/386 |
| 2016/0370717 A1 | 12/2016 | Den Boef et al. | |
| 2017/0184981 A1 | 6/2017 | Quintanilha et al. | |
| 2018/0364036 A1* | 12/2018 | Jak | G03F 7/70683 |

FOREIGN PATENT DOCUMENTS

| | | |
|---|---|---|
| WO | 2016012316 | 1/2016 |
| WO | 2018077651 | 5/2018 |

OTHER PUBLICATIONS

International Search Report and Written Opinion issue in corresponding PCT Application No. PCT/EP2019/079640, dated Feb. 5, 2020.

Office Action issued in corresponding Chinese Patent Application No. 201980079479.3, dated Jan. 30, 2024.

* cited by examiner

Fig. 5
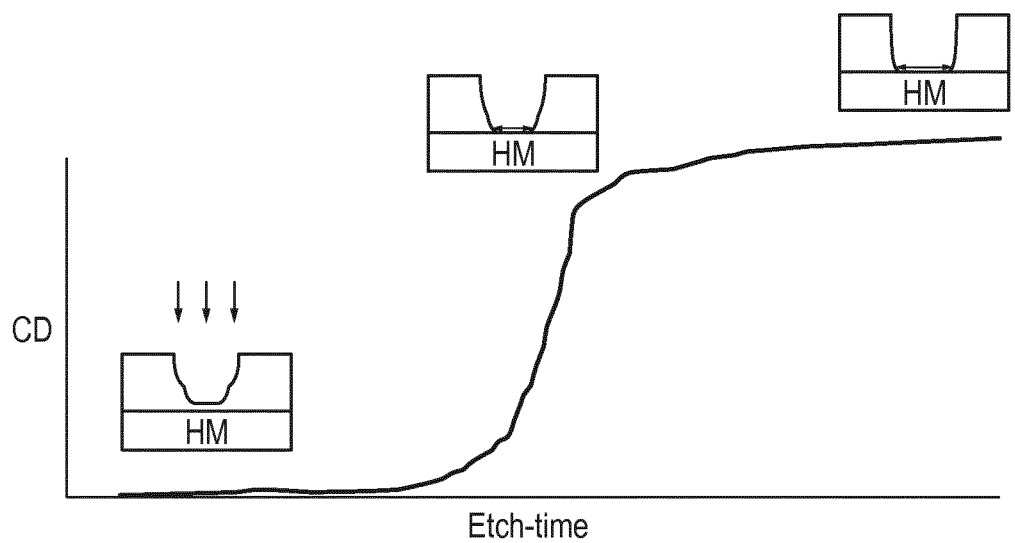
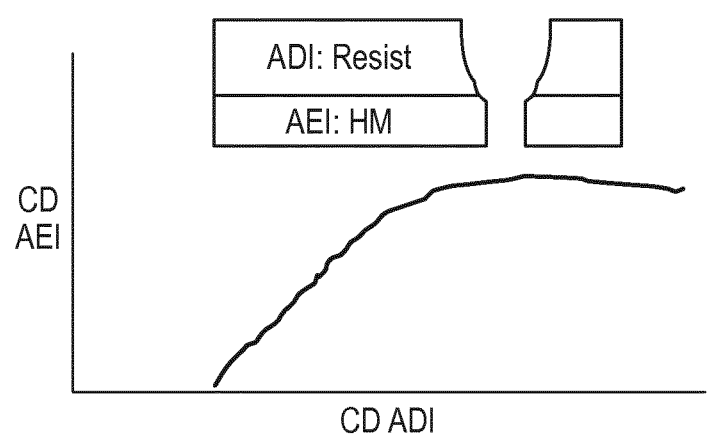

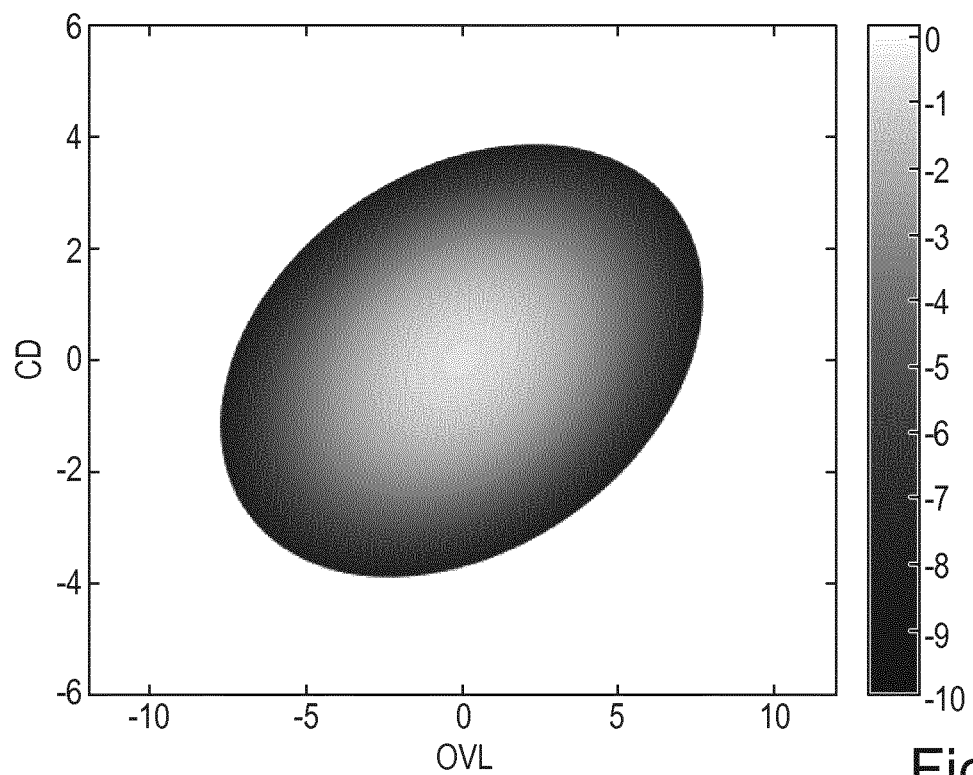
Fig. 7
Fig. 8
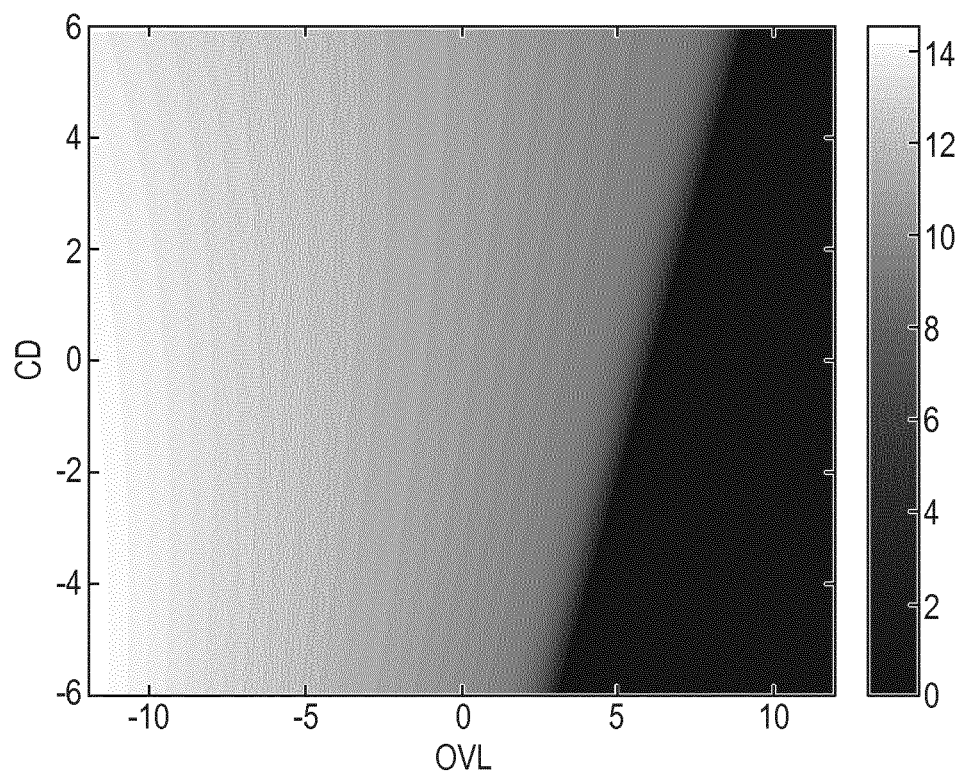

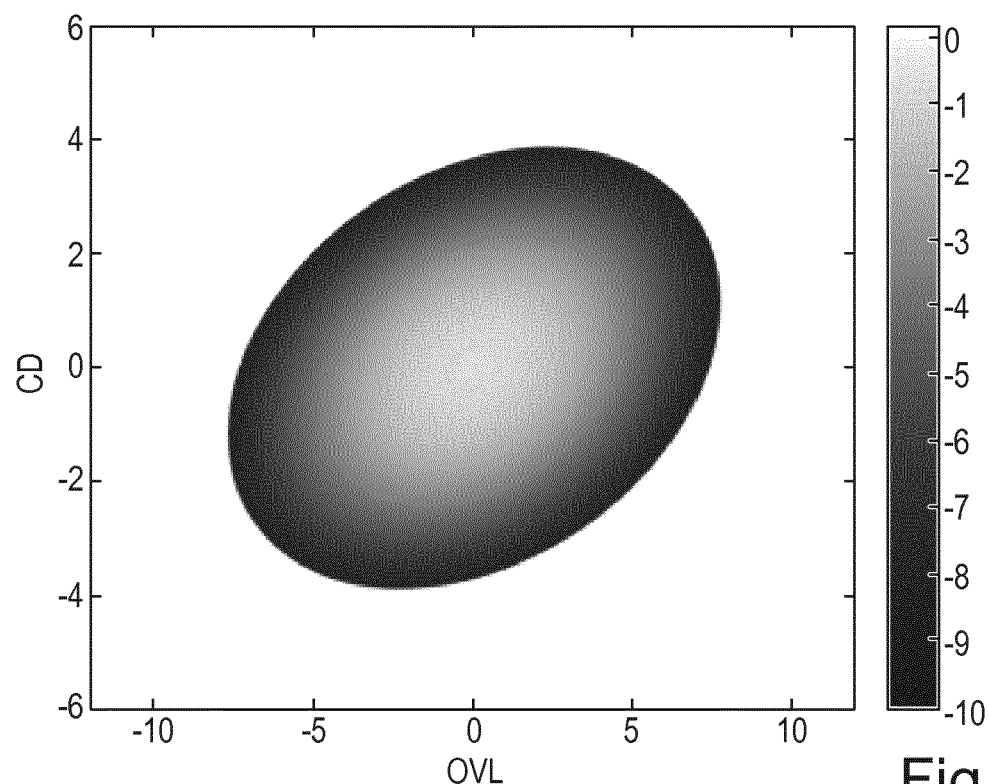
Fig. 10
Fig. 11
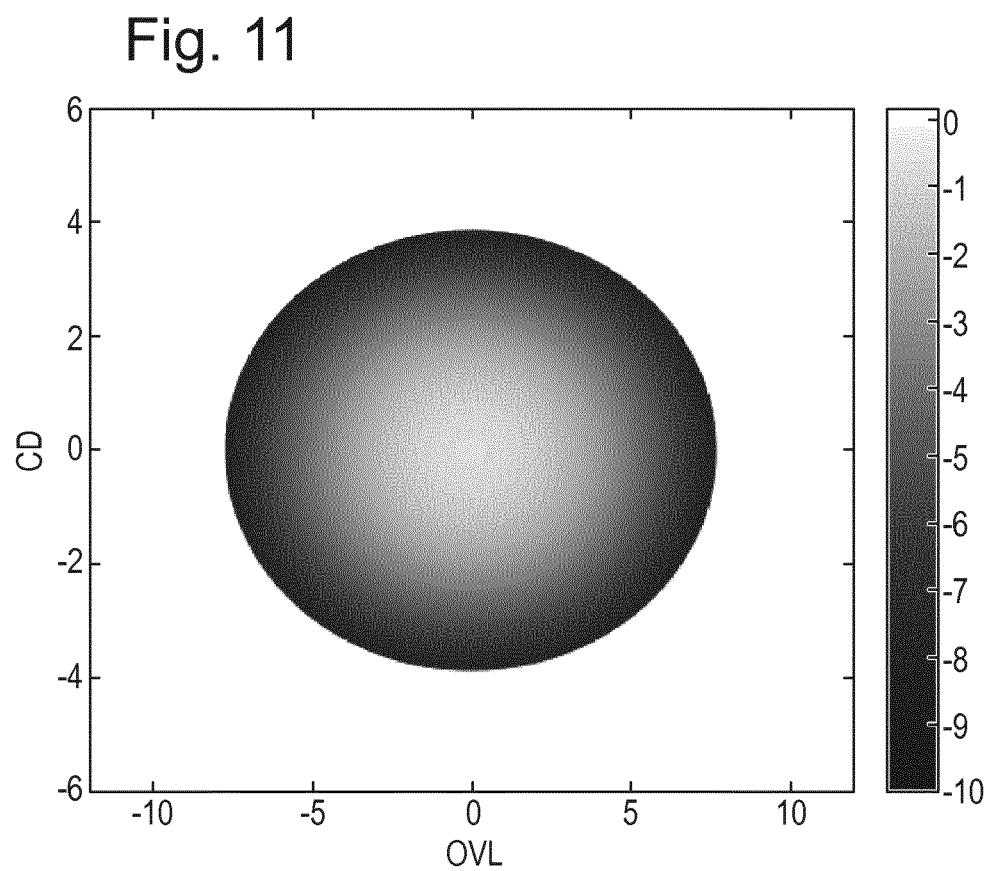

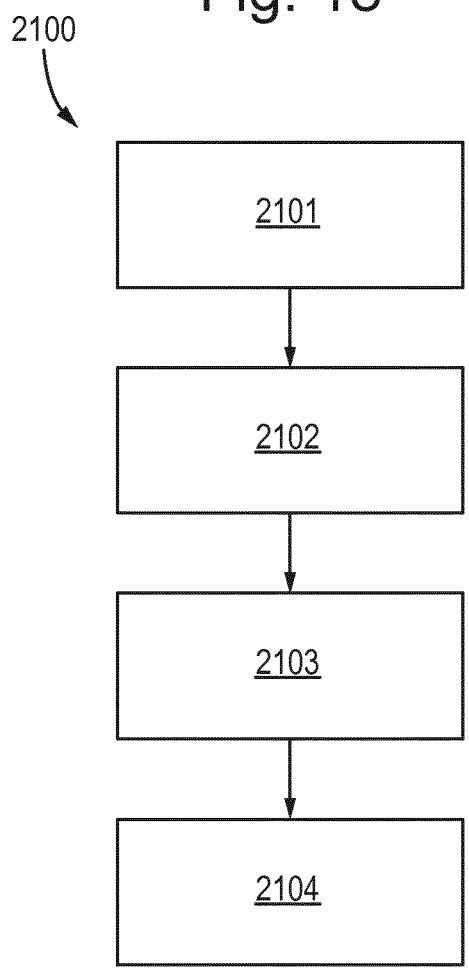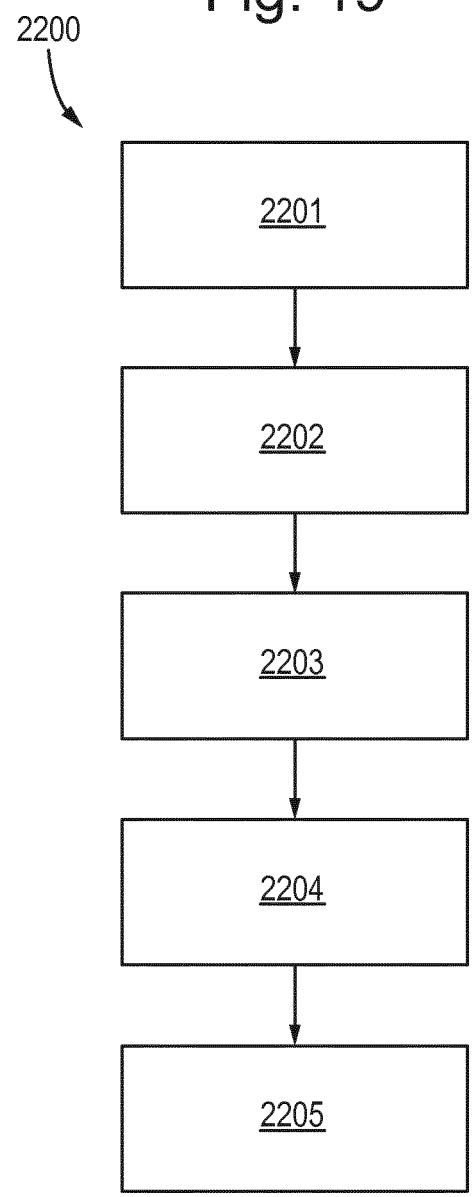

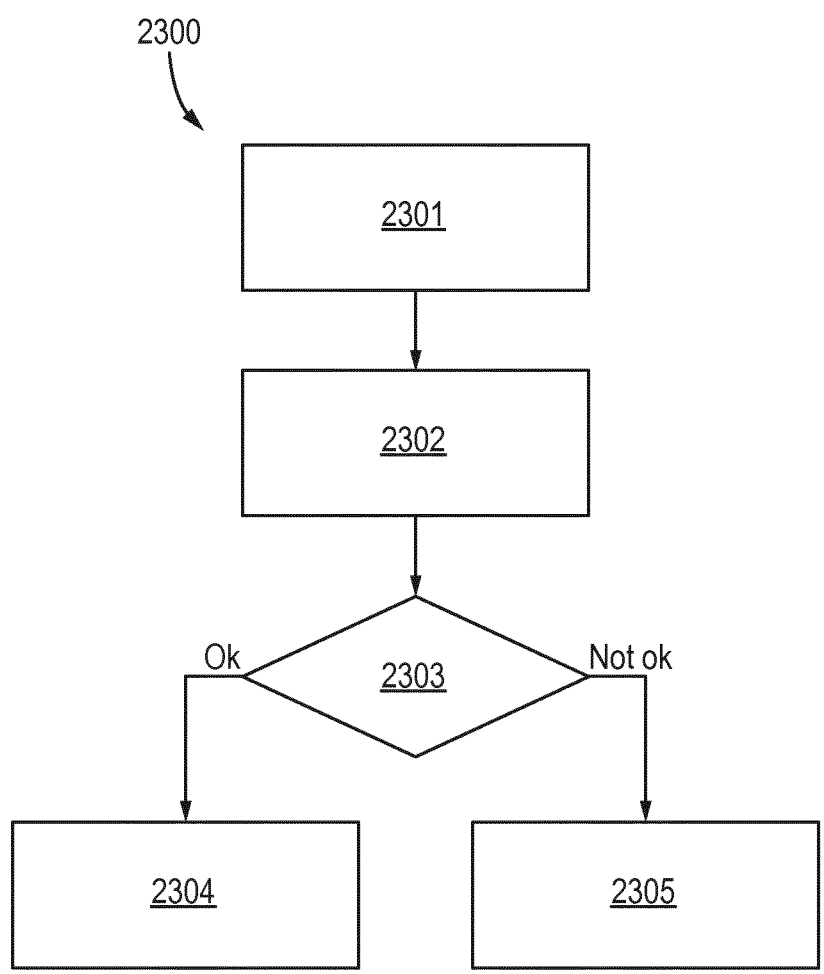

METHOD OF MANUFACTURING DEVICES

CROSS-REFERENCE TO RELATED APPLICATIONS

This application is the U.S. national phase entry of PCT Patent Application No. PCT/EP2019/079640 which was filed on Oct. 30, 2019, which claims the benefit of priority of U.S. Patent Application No. 62/774,480 which was filed on Dec. 3, 2018 and of U.S. Patent Application No. 62/814,544 which was filed on Mar. 6, 2019, each of which is incorporated herein in its entirety by reference.

FIELD

The present description relates to methods of manufacturing devices, especially using lithographic processes, and to the analysis and control of manufacturing processes.

BACKGROUND

There is a continuing desire to manufacture devices, e.g. integrated circuits, with ever smaller features. Integrated circuits and other microscale devices are often manufactured using optical lithography, but other manufacturing techniques, such as imprint lithography, e-beam lithography and nano-scale self-assembly are known.

SUMMARY

When printing a pattern using, e.g., lithography, one or more various parameters of the exposure, for example focus and dose, can be varied to affect characteristics of the printed pattern, such as CD and CDU. Similarly, one or more parameters of a process step, e.g. etch time, can also be varied. Conventionally a process recipe, which specifies values of the controllable parameters to be used during exposure of a specific pattern and subsequent process steps, is optimized to maximize yield. Yield is usually defined as the proportion of correctly printed devices. In some cases, an exposure recipe might be optimized to maximize throughput, that is the rate at which substrates are exposed. In some cases, an exposure recipe is optimized to maximize process window, that is the tolerance by which one or more control parameters can vary from its nominal value while still obtaining a valid exposure.

However, optimizing the process recipe often involves various rules of thumb or best-practices because fully characterizing the effects of varying all the variable parameters of the exposure and subsequent process steps involves a very large number of trial exposures and measurements or simulations.

Improved methods of optimizing and controlling device manufacturing methods are desirable.

According to an embodiment, there is provided a method for analyzing a process, the method comprising: obtaining a multi-dimensional probability function representing an expected distribution of values for a plurality of process parameters; obtaining a performance function relating values of the process parameters to a performance metric of the process; and using the performance function to map the multi-dimensional probability function to a performance probability function having the process parameters as arguments.

According to an embodiment, there is provided a device manufacturing method comprising: exposing a radiation-sensitive layer on a substrate to form a latent image therein; developing the radiation-sensitive layer to fix the latent image; and transferring the fixed image onto the substrate, wherein the exposing, developing and/or transferring is performed using a set of nominal process settings determined by the method described above.

According to an embodiment, there is provided a device manufacturing method comprising: exposing a radiation-sensitive layer on a substrate to form a latent image therein; developing the radiation-sensitive layer to fix the latent image as a developed image; transferring the fixed image onto the substrate to form a device feature or a measurement target; measuring a characteristic of the latent image, the developed image, the device feature and/or the measurement target; and using a performance probability function determined according to the method described above and the measured characteristic to determine a process setting for a subsequent exposing, developing and/or transferring step.

According to an embodiment, there is provided a computer program comprising instructions that, when executed by one or more computers and/or lithography tools, instruct the computers and/or lithography tool(s) to perform a method as described herein.

BRIEF DESCRIPTION OF THE DRAWINGS

Embodiments of the invention will now be described, by way of example only, with reference to the accompanying schematic drawings, in which:

FIG. 5 depicts the effect on critical dimension (CD) of varying etch time in an etch step;

FIG. 7 is a graph showing an exemplary multivariate normal distribution of overlay and CD values in manufactured devices with a particular covariance matrix;

FIG. 8 is a graph showing a relationship between edge placement error (EPE), overlay (OVL) and CD in an exemplary device pattern;

FIGS. 10 to 12 are graphs showing exemplary multivariate normal distribution distributions of overlay and CD values in manufactured devices for different amounts of correlation between overlay and CD;

FIG. 18 is a flowchart of a method of determining a process window according to an embodiment of the invention;

FIG. 19 is a flowchart of a device manufacturing method according to an embodiment of the invention;

FIG. 20 is a flowchart of a device manufacturing method according to an embodiment of the invention;

EXEMPLARY EMBODIMENTS

Figure 1:
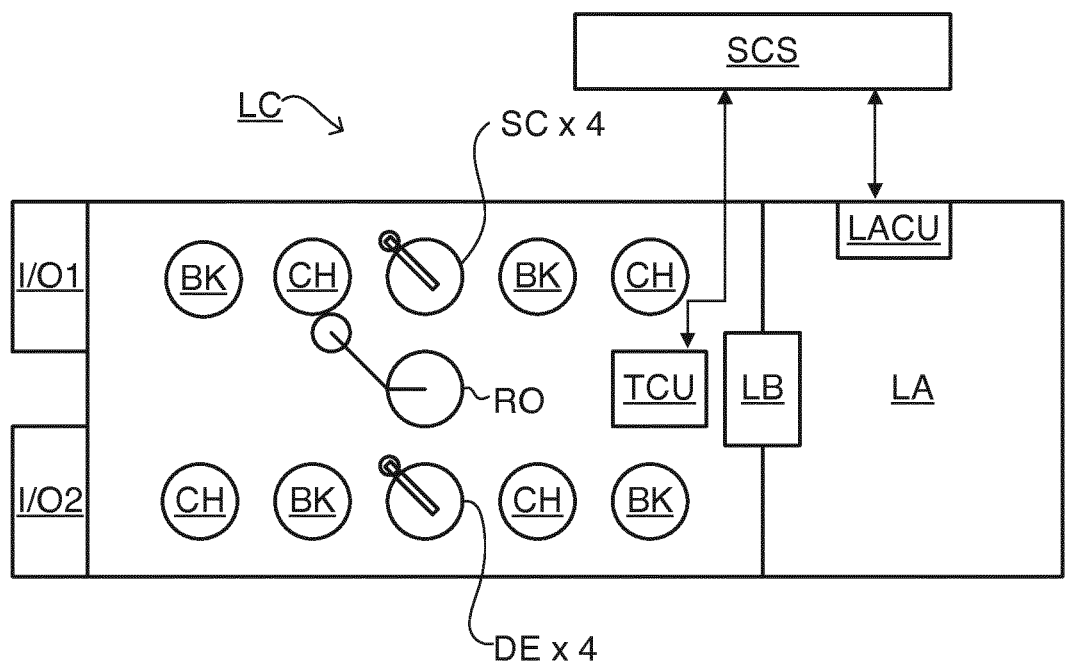
FIG. 1 depicts a lithocell.
Figure 2:
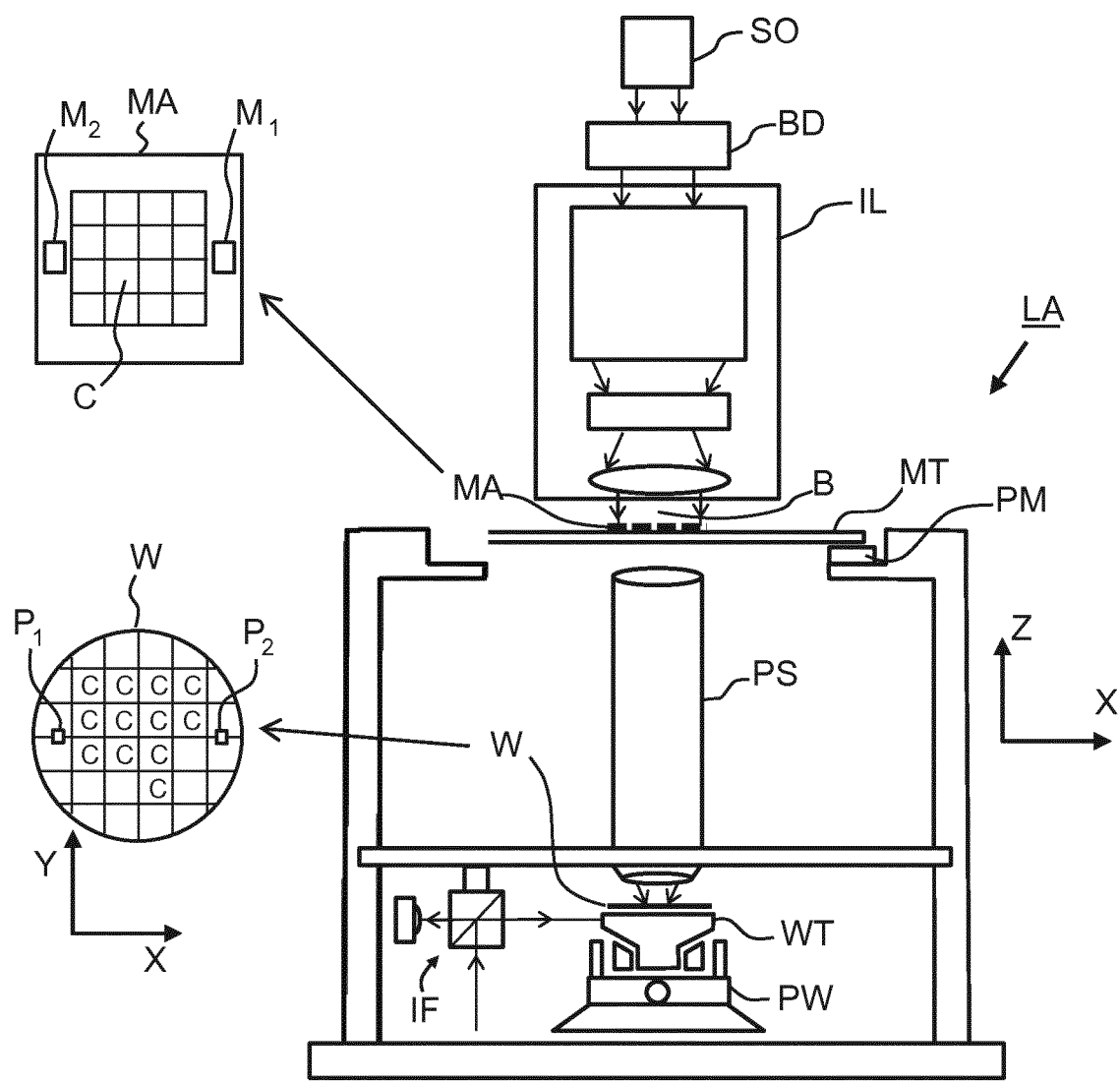
FIG. 2 depicts a lithographic apparatus.
Figure 3:
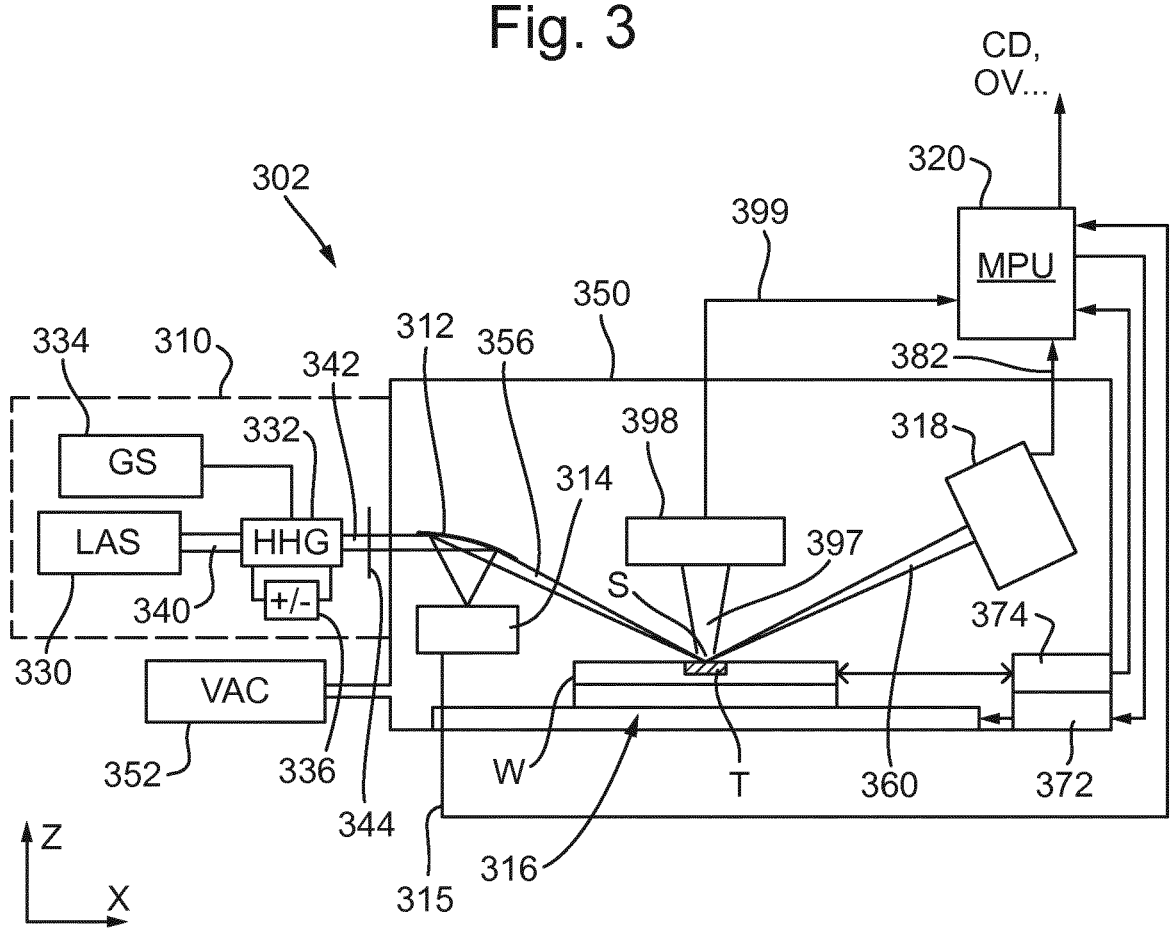
FIG. 3 depicts a schematic overview of a metrology apparatus.
Figure 4:
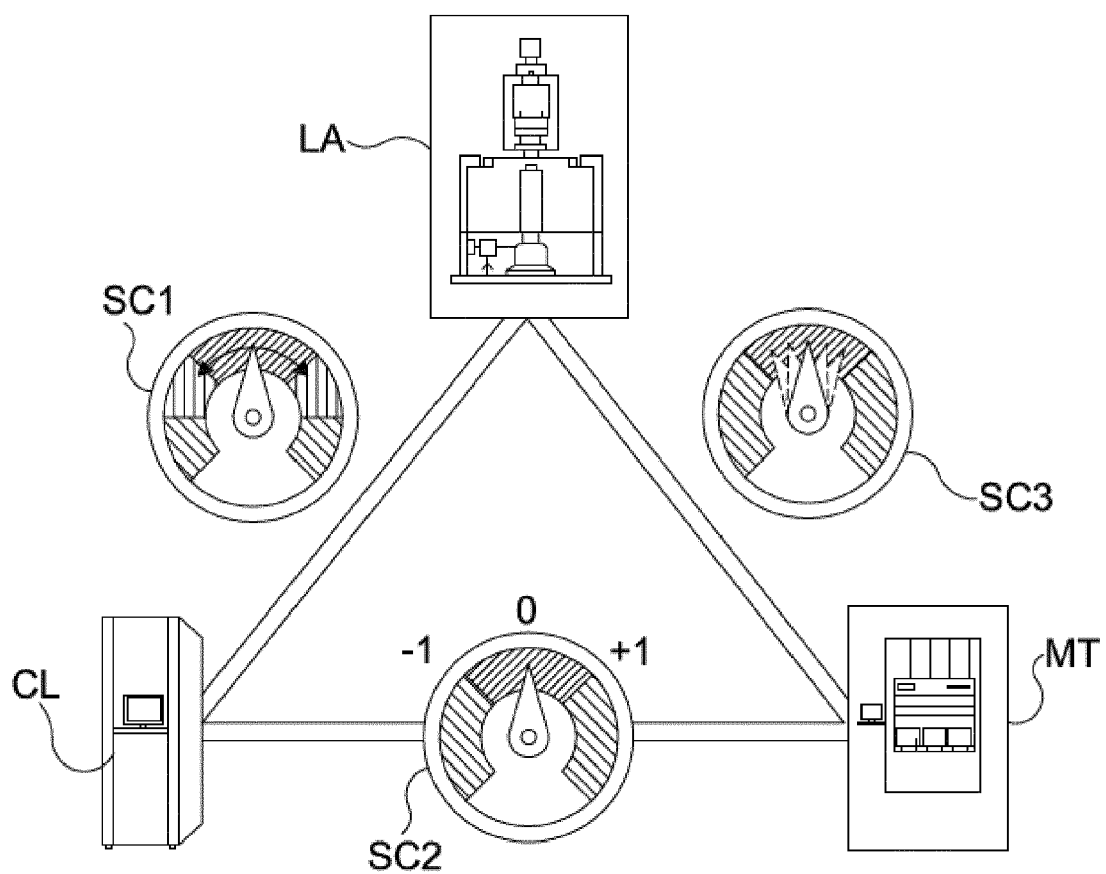
FIG. 4 depicts a method of holistic lithography.

A lithocell is schematically depicted in FIG. 1. A lithocell is an integrated system comprising a lithographic apparatus, e.g. as schematically depicted in FIG. 2, one or more substrate processing devices or apparatuses, and an inspection apparatus, e.g. as schematically depicted in FIG. 3. The lithocell can be configured to perform a process of holistic lithography which takes advantage of a tight control loop as depicted in FIG. 4. The lithographic apparatus, lithocell and holistic lithography process are described below. The lithographic apparatus, lithocell and inspection apparatus can be used in a method of device manufacture according to an embodiment of the invention, which is described further below.

FIG. 2 schematically depicts a lithographic apparatus LA. The lithographic apparatus LA includes an illumination system (also referred to as illuminator) IL configured to condition a radiation beam B (e.g., UV radiation, DUV radiation or EUV radiation), a patterning device support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

As shown in FIG. 1 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure one or more properties of patterned structures, such as overlay error values between subsequent layers, line thickness values, critical dimension values (CD), etc. For this purpose, inspection tools (not shown) may be included in the lithocell LC. If an error is detected, an adjustment, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine one or more properties of the substrates W, and in particular, how values of one or more properties of different substrates W vary or how values of one or more properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the one or more properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Inspection tools are often referred to as metrology tools. Different types of metrology tools for making such measurements are known, including scanning electron microscopes or various forms of scatterometer metrology tools. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. Patent Application Publication Nos. US 2010-0328655, US 2011-102753, US 2012-0044470, US 2011-0249244, and US 2011-0026032 and in European Patent Application Publication No. EP1628164. Each of the foregoing patent application publications is incorporated herein in its entirety by reference. Aforementioned scatterometers may measure gratings using radiation from soft x-ray and visible to near-IR wavelength range.

In an embodiment, the scatterometer is an angular resolved scatterometer. In such a scatterometer reconstruction methods may be applied to the measured signal to reconstruct or calculate one or more properties of the periodic structure or grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In an embodiment, the scatterometer is a spectroscopic scatterometer. In such spectroscopic scatterometer, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In an embodiment, the scatterometer is a ellipsometric scatterometer. The ellipsometric scatterometer allows for determining one or more parameters of a lithographic process by measuring scattered radiation for each polarization state. Such metrology apparatus emits polarized radiation (such as linear, circular, or elliptic polarization) by using, for example, one or more appropriate polarization filters in the illumination section of the metrology apparatus. A source suitable for the metrology apparatus may provide polarized radiation as well. Various embodiments of existing ellipsometric scatterometers are described in U.S. Patent Application Publication Nos. US 2007/0296960, US 2008/0198380, US 2009/0168062, US 2010/0007863, US 2011/0032500, US 2011/0102793, US 2011/0188020, US 2012/0044495, US 2013/0162996, and US 2013/0308142, each of which is incorporated herein in its entirety by reference.

In an embodiment, a scatterometer is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the substrate. The scatterometer may have a symmetrical detection configuration as described e.g. in European Patent Application Publication No. EP1,628,164, which is incorporated herein in its entirety by reference, such that any asymmetry is clearly distinguishable. This provides a straightforward way to measure misalignment in gratings. Further examples for measuring overlay error between the two layers containing periodic structures as target is measured through asymmetry of the periodic structures may be found in PCT Patent Application Publication No. WO 2011/012624 and U.S. Patent Application Publication No. US 2016/0161863, each of which incorporated herein in its entirety by reference.

Other parameters of interest may be focus and dose. Focus and dose may be determined simultaneously by scatterometry (or alternatively by scanning electron microscopy) as described in U.S. Patent Application Publication No. US2011/0249244, which is incorporated herein in its entirety by reference. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after an etch process for example. Typically the pitch and line-width of the structures in the gratings strongly depend on the measurement optics (in particular the numerical aperture (NA) of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similarly to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. Patent Application Publication Nos. US2016/0161863 and US 2016/0370717, each of which is incorporated herein in its entirety by reference.

Typically the patterning process in a lithographic apparatus LA is a significant step in the processing and involves high accuracy of dimensioning and placement of structures on the substrate W. To help ensure this high accuracy, three systems may be combined in a control environment as schematically depicted in FIG. 4. One of these systems is the lithographic apparatus LA which is (virtually) connected to a metrology tool MET (a second system) and to a computer system CL (a third system). An aim of such a control environment is to optimize the cooperation between these three systems to enhance the overall process window and provide tight control loops to help ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which patterning device (e.g., mask) layout and lithographic apparatus settings achieve a large or largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

FIG. 3 depicts a schematic representation of a metrology apparatus 302 in which radiation in the wavelength range from 0.1 nm to 100 nm may be used to measure one or more parameters of structures on a substrate. The metrology apparatus 302 presented in FIG. 3 is suitable for the soft X-rays (SXR) or EUV domain.

FIG. 3 illustrates a schematic physical arrangement of a metrology apparatus 302 comprising a spectroscopic scatterometer using EUV and/or SXR radiation, purely by way of example. An alternative form of inspection apparatus might be provided in the form of an angle-resolved scatterometer.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Alternatives to a HHG source are a Discharge Produced Plasma (DPP) source, a Free Electron Laser (FEL) source, an Inverse Compton Scattering (ICS) source or a compact synchrotron. HHG sources are available for example from KMLabs, Boulder Colorado, USA. Main components of the radiation source are a drive laser 330, LAS and an HHG gas cell 332, HHG. A gas supply 334, GS supplies suitable gas to the gas cell, where it is optionally ionized by an electric source 336. The drive laser 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where, in the gas, a portion of the radiation is converted to higher frequencies than the first radiation to form a beam 342 including coherent second radiation of the desired wavelength or wavelengths.

The second radiation may contain multiple wavelengths. If the radiation were monochromatic, then measurement calculations (for example reconstruction of the structure of interest) may be simplified. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Kr, Xe gases, or mixtures thereof (including with Ne or Ar), can be used. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that EUV and SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore choosing a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The gas pressure within inspection chamber 350 is maintained near vacuum by vacuum pump 352, VAC, so that, e.g., EUV or SXR radiation can pass through the focusing system without undue attenuation. The illumination system 312 has the function of focusing the radiation into a focused beam 356, and may comprise for example a two-dimensionally curved mirror, or a series of one-dimensionally curved mirrors, as described in U.S. Patent Application Publication No. US2017/0184981, which is incorporated herein in its entirety by reference. The focusing is performed to achieve a round or elliptical spot S less than approximately 10 µm in diameter, when projected onto the structure of interest. This can be achieved by directly imaging the source onto an image plane or by imaging a small aperture, which is irradiated by the source, onto an image plane. Substrate support 316 comprises for example an X-Y-Z translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to metrology processing unit 320 and may comprise information about the spectrum of the filtered beam 342 and/or the intensities of the different wavelengths in the filtered beam.

Reflected radiation 360 is captured by detector 318 and a spectrum 382 is provided to processing unit 320 for use in calculating a property of the target structure T. The illumination system 312 and detection system 318 thus form an inspection apparatus. This inspection apparatus may comprise a soft X-ray and/or EUV spectroscopic reflectometer of the kind described in U.S. Patent Application Publication No. 2016/282282, which is incorporated herein in its entirety by reference.

If the target T has a certain periodicity, the radiation of the focused beam 356 may be partially diffracted as well. The diffracted radiation 397 follows another path at well-defined angles with respect to the angle of incidence and the reflected radiation 360. In FIG. 3, the drawn diffracted radiation 397 is drawn in a schematic manner and diffracted radiation 397 may follow many other paths than the drawn paths. The inspection apparatus 302 may also comprise one or more further detection systems 398 that detect and/or image at least a portion of the diffracted radiation 397. In FIG. 3 a single further detection system 398 is drawn, but embodiments of the inspection apparatus 302 may comprise a plurality of further detection systems 398 that are arranged at different positions to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generate a signal 399 that is provided to the metrology processing unit 320. The signal 399 may include information of the diffracted radiation 397 and/or may include images obtained from the diffracted radiation 397.

To aid the alignment and focusing of the spot S with desired product structures, inspection apparatus 302 may provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via one or more sensors. One or more sensors 374 may include one or more interferometers or encoders, for example, which can measure the position of the substrate support 316 with an accuracy in the region of picometers (pm). In the operation of the inspection apparatus 302, spectrum data 382 captured by detection system 318 is delivered to metrology processing unit 320.

In an embodiment, the inspection apparatus uses soft X-ray and/or EUV radiation at any suitable incidence, e.g. normal incidence, near-normal incidence or grazing incidence, for example to perform diffraction-based measurements of asymmetry. The angle of incidence may also be in the range from 20 to 40 degrees, for example, 30 degrees.

The inspection apparatus can be provided in a hybrid metrology system. Performance parameters to be measured can include overlay (OVL, OV), critical dimension (CD), via contact landing (a combination of CD and OVL) and/or CD uniformity (CDU). Measurement techniques can include coherent diffraction imaging (CDI) and at-resolution overlay (ARO) metrology.

The soft X-ray and/or EUV radiation may for example have wavelengths less than 100 nm, for example using radiation in the range 5-30 nm, or optionally in the range from 10 nm to 20 nm. The radiation may be narrowband or broadband in character. The radiation may have discrete peaks in a specific wavelength band or may have a more continuous character.

The inspection apparatus 302 can be used to measure structures within the resist material treated within the lithocell (e.g., after development inspection (ADI)), and/or to measure structures after they have been formed in harder material (e.g., after etch inspection (AEI)). For example, substrates may be inspected using the inspection apparatus 302 after they have been processed by a developing apparatus, etching apparatus, annealing apparatus and/or other apparatus including thin layer deposition and ion implantation (doping) equipment.

When developing a new process for forming one or more layers of a device using a lithographic process, extensive work has to be carried out to determine the appropriate settings for the exposure, e.g. focus and dose, and the subsequent process step(s), e.g. etch time and deposition thickness. A common aim when developing a process is to improve or maximize the yield of the process, i.e. the fraction of manufactured devices that function to specifications. A process for a specific layer may be improved or optimized by reference to a specific performance metric, e.g. edge placement error (EPE), that is most strongly related to yield, and by reference to a specific feature that is significant or critical to proper functioning of a device.

Such a performance metric may be related to one or more other characteristics of a pattern printed on a substrate. For example, edge placement error is related to critical dimension (CD) and overlay (pattern placement error). CD, and also overlay, are affected by one or more tool-control parameters, e.g., dose and/or focus. Thus, when a pattern or feature is printed multiple times per substrate and on multiple substrates, the actual values of the one or more characteristics will be distributed around the respective target values. The one or more tool-control parameters often exhibit strong correlation. For example, the edge of a substrate is often not clamped to a substrate holder with the same force as the center of the substrate, leading to a curvature in the substrate. The lithographic apparatus may try to compensate for this with a focus-control loop that leaves significant residual error. In other words there can be significant focus error at the edge of the substrate. This focus error leads to CD error. Furthermore, non-telecentricity of the projection system means that a focus error can also lead to overlay error.

In addition, further processing of the geometry transferred to resist is often non-linear, for example, by virtue of etch-loading, non-conformal behavior of deposition, and/or dishing within chemical mechanical polishing, which is dependent on e.g. the local density of a pattern. Both the strong correlation between measured values of one or more parameters, e.g. CD and overlay, and the non-linear transfer towards an actual geometry of interest for the yield of the device, leads to a non-normal distribution.

A typical manufacturing device has a very large number of geometric features (>$10^9$). If one significant feature fails, the device fails. It is therefore desirable to measure and inspect a very large number of features in order to help ensure that appropriate settings (OVL, CD, etch-time, ... ) of the lithographic and processing apparatus are sufficiently optimized to enable a good yield.

Thus, to fully determine the effect of change in one or more process settings on the yield involves a large number of test exposures and measurements. A better approach to optimizing lithographic processes, e.g. that requires less time and effort and/or provides an improved result, is therefore desirable.

Accordingly, an embodiment of the invention provides a method 2100, depicted in FIG. 18, for analyzing a process, e.g. to enable the process to be improved or optimized or for use in control of the process in production. The method comprises obtaining 2101 a multi-dimensional probability density function (as an example of a multi-dimensional probability function) representing an expected distribution of values for a plurality of process parameters. The process parameters can be process settings, i.e. control values that are applied to a process tool such as focus or dose, or characteristics of a pattern, e.g. CD, which are stable and controlled by one or more process settings. A characteristic such as CD is related to focus and dose in a stable manner so that considering the distribution of CD rather than the underlying one or more process settings can simplify the method described herein. The values of the process parameters can be directly measured on one or more substrates and a model used that fits the distribution type. For example, one can fit these values with a multi-variate normal distribution:

$$f_X(OVL, CD, \ldots) = \frac{\exp(-1/2(x-\mu)^T \sum^{-1}(x-\mu))}{\sqrt{(2\pi)^k |\Sigma|}} \quad (1)$$

where the variables have a particular correlation that can be determined from measurements of individual parameters over the substrate through its unbiased estimator:

$$\Sigma_{xy} = \text{sum}_{ij}(X_i - \text{mean}(X))^*(Y_j - \text{mean}(Y))/\text{sqrt}(n-1) \quad (2)$$

where n is the number of measurements. These then fill the covariance matrix Sigma described before.

It is also possible to account not only for variations that happen on the tool scale (~mm² and larger), but also for variations in process parameter distributions on the local scale (feature-feature) by applying a defect-based process-window methodology in an exposure matrix (e.g. focus layer 1-dose layer 1-ovl—focus layer 2—dose layer 2).

The method also comprises obtaining 2102 a performance function relating values of the process parameters to a performance metric of the process. The performance function may be referred to herein as a transfer function or transfer curve. Then, the performance function is used to map 2103 the probability density function of the individual tool-parameters to a performance probability function having the process parameters as arguments. The performance probability function can then be used to analyze 2104 the process, e.g. to determine for a given set of values for the process parameters the probability of manufactured devices functioning correctly. The probability of correct functioning may be considered equivalent to the probability of a performance metric being within a desired limit, e.g. that the device EPE value is less than 6 nm.

Embodiments of the present invention are advantageous because fewer measurements and/or simulations are used to obtain the probability density function and performance function than would be used to obtain directly a function linking the process parameters to yield. In order to qualify the full distribution function relevant to yield (in particular tail-behavior), one needs to make a large number of measurements (e.g. ~$10^9$ in a typical device). If the transfer-curve or one parameter changes, it becomes necessary to redo the full qualification. Tool-parameters (OVL/CD) can be measured at higher throughput than those limiting in the lithographic apparatus (e.g. requiring TEM), and the distribution-types of the tool-parameters are often better behaved, i.e. require fewer parameters to model.

It is desirable that process parameters are selected based on how their values are distributed. e.g. according to a certain characteristic of their associated statistical distribution. For example the characteristic is based on a similarity to a normal distribution (sometimes referred to as a Gaussian distribution). A normal distribution can be characterized (i.e. determine the mean and variation) using fewer data points than other distributions. A normal distribution can usually be characterized adequately using $10^2$ to $10^4$ measurements, whereas to accurately predict failure rates of the order of $10^{-6}$ by direct measurements of the critical performance metric would require of the order of $10^9$ measurements. If a parameter of interest does not have a normal distribution, it may be possible to identify one or more underlying parameters that do have a normal distribution and which can be used instead. Alternatively, one can rely on parameters which are measured frequently by the lithographic and processing apparatus and use its distribution directly.

In an embodiment, the selected process parameters are at least partially correlated. Correlation between the process parameters can have a significant effect on failure rates so that it is desirable to properly take it into account. Selecting correlated process parameters can improve the accuracy of the results without an increase in the number of measurements taken.

An embodiment of the invention provides a particular advantage where the performance function is non-linear, for example edge placement error. When the performance function is non-linear, small changes in conditions can lead to very large changes of failure rates. Thus, large numbers of measurements are involved in conventional techniques for characterizing processes, especially if the location of the non-linearity of the performance function is not well known.

In an embodiment of the invention, the method further comprises identifying a sub-space of process parameter values (e.g. one or more ranges of the process parameters) for which the performance probability function meets a criterion, e.g. that failure rate is lower than a selected threshold. Depending on the process parameters selected, the sub-space (defined by one or more ranges defining a closed space embedded within a space spawned by dimensions associated with the individual process parameters) may be the process window or may allow the process window to be derived. A set of nominal process settings for a lithographic process that falls within the sub-space can therefore be selected, manually or automatically, for use in a device manufacturing method.

An embodiment of the present invention can be used in a method 2200 for process validation, as depicted in FIG. 19. First an initial recipe is obtained 2201. (Test) substrates are exposed and measured 2202 or simulated. The measurement or simulation results are analyzed 2203 as described above to derive the performance probability function and optionally a process window. If the analysis reveals deficiencies in the recipe, e.g. an insufficient process window, the recipe is improved 2204. Steps 2202 and 2203 can be repeated as necessary until the process is satisfactory. The production substrates are exposed 2205.

In an embodiment of the invention, the performance probability function can be used in a method 2300 for process control as depicted in FIG. 20. Substrates are exposed 2301 and optionally processed to transfer the pattern formed in the exposure step into (a layer of) the substrate. Then a characteristic of at least one selected from: a latent image, a developed image, a device feature and/or a measurement target is measured 2302. The performance probability function determined as described above and the measured characteristic can be used to determine 2303 a process setting for a subsequent exposing, developing or transferring step 2304. For example, if a CD or overlay measurement suggests the substrate is near the edge of the process window, a compensatory adjustment of the etch time can be made or a more reliable etch tool selected. Alternatively, the substrate can be reworked 2305 if the analysis 2303 indicates the probability of failure is too high. In this way, rejection and rework rates can be reduced, improving yield.

An embodiment of the present invention can be embodied in a computer program comprising instructions that, when executed by one or more lithography tools, instruct the lithography tool(s) to perform all or part of the method described above. Steps of the method can be performed in computers integrated in lithography apparatus and/or other tools, such as metrology tools or process tools, or separate computing systems.

An embodiment of the invention will be further described below with reference to exemplary device patterns, but it will be readily appreciated that the principles of the invention apply equally to other patterns.

FIG. 5 is an example of a non-linear transfer function. In the upper graph, the bottom-CD measured at the interface of two layers (e.g. a resist and a underlying hard mask to which to which the pattern is initially transferred before further processing) is shown as a function of etch-time. In the lower graph, the CD measured in an underlying hard mask is shown as a function of the CD as measured in resist. It will be seen that the CD at the interface has a strong non-linear characteristic: remaining negligible until the etch time reaches a certain level, then rising rapidly before plateauing. Additionally, the relationship between CD at the interface and CD of the underlying hard mask after etch is non-linear so that the relationship between a process setting that affects CD in resist and the CD in the underlying hard mask is complex.

Figure 6A:
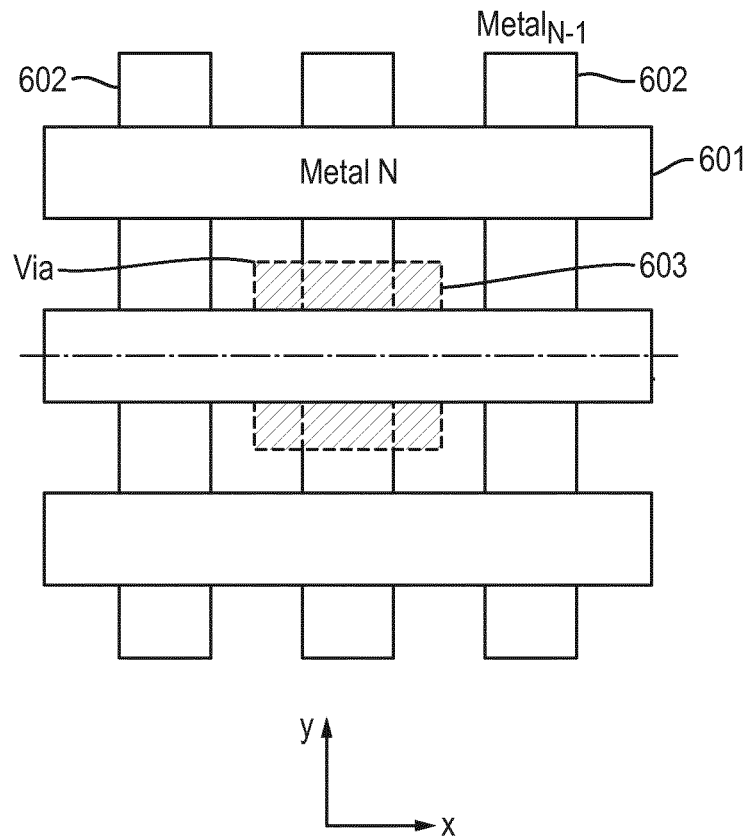
FIGS. 6(a), 6(b), 6(c) and 6(d) depict a method of device manufacture.
Figure 6B:
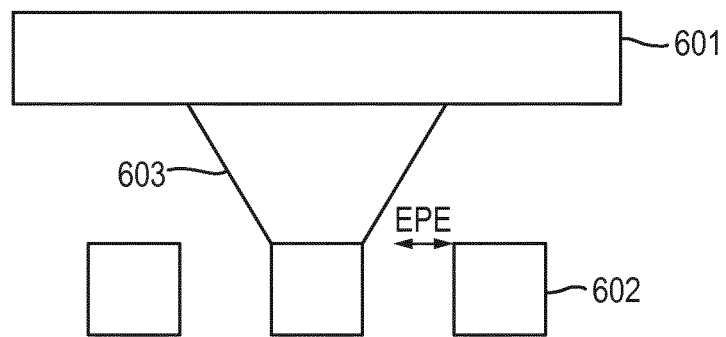
Figure 6C:
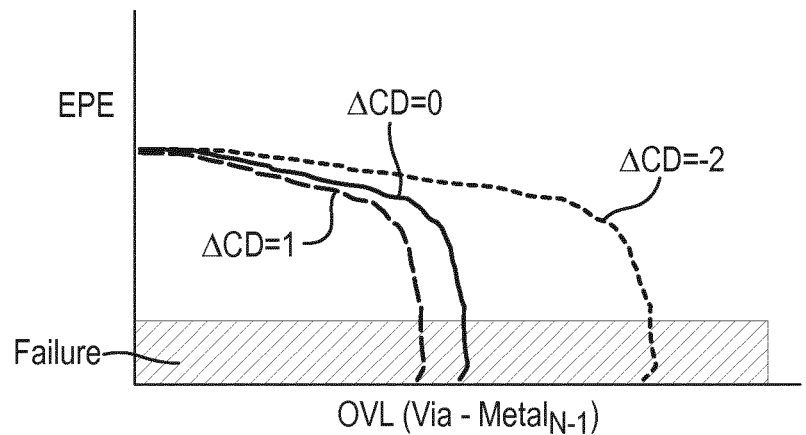
Figure 6D:
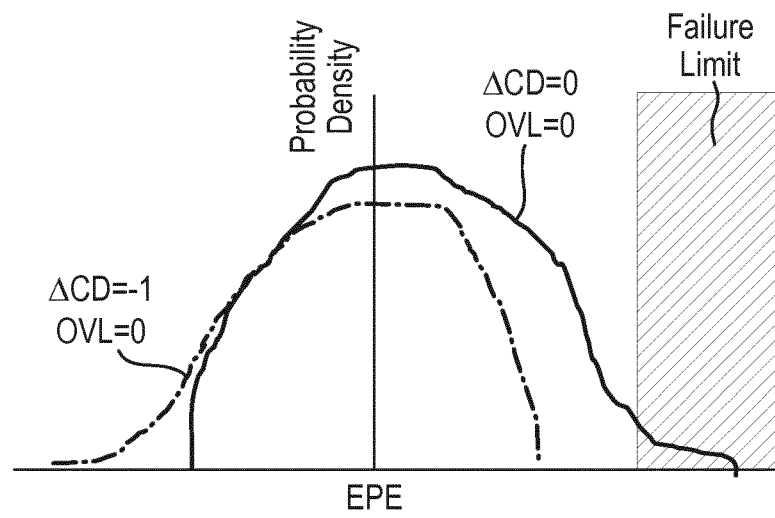

Another example of a non-linear process is shown in FIGS. 6(a) to (d). FIG. 6(a) shows two metal lines (upper 601, lower 602) that need to be connected to each other by a via 603. The y-direction of the via 603 is self-aligned, in this example, with respect to the upper line 601 by a dual-damascene process-flow. The bottom of the via 603 in the horizontal/x-direction is not self-aligned with the via but has a certain design taper as shown in FIG. 6(b). The bottom of the via 603 should have a minimum separation (EPE) compared to the neighboring line to avoid a short or electromigration-related reliability issues. FIG. 6(c) is a graph of EPE vs OVL for different ΔCD values showing that the minimum distance (EPE) is a non-linear function of both the CD and OVL due to etch-loading and the related via-snapping (a tendency for the etch to gravitate towards the closest line in the layer below). FIG. 6(d) is a graph of probability density vs EPE for different CD and OVL values showing that even for a normally distributed OVL and CD distribution across the substrate, the final EPE distribution depends on the nature of the transfer function as well as the correlation between the two parameters.

To address these issues, an embodiment of the invention provides a process to fully characterize the multi-dimensional window and reduce or minimize the measurements involved.

Figure 9:
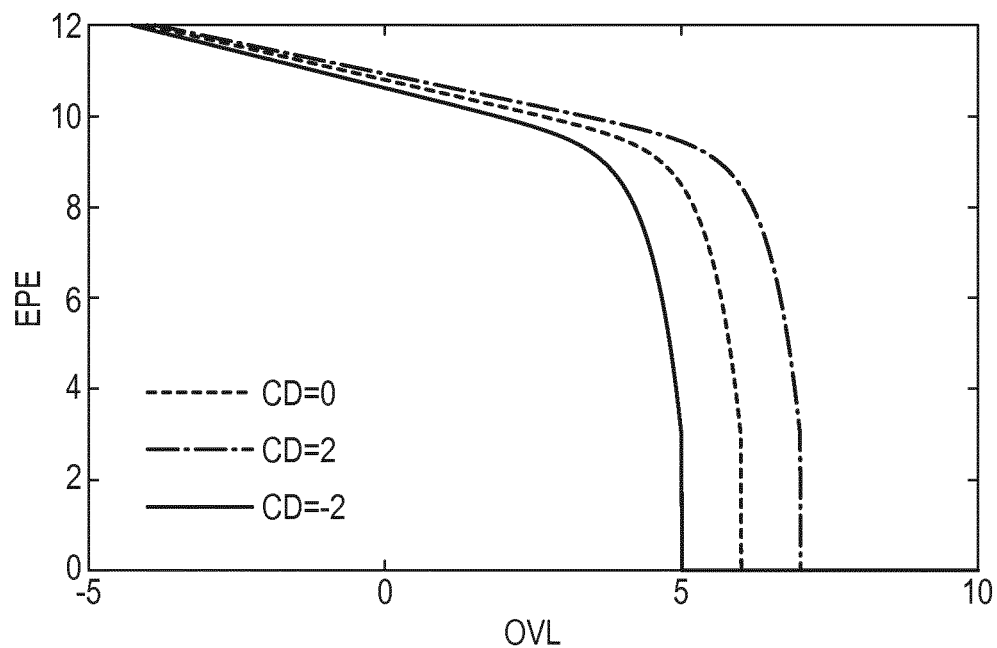
FIG. 9 is a graph showing a relationship between edge placement error and overlay at three different CDs in an exemplary device pattern; the lines in the graph represent cross-sections of the graph in FIG. 8.

The basic steps of the embodiment are depicted in FIGS. 7 to 9. Instead of measuring the EPE distribution directly, the variation of process parameters (which may also be referred to as input parameters) is measured. Input parameters that are known to be stable or can be controlled and are desirably normally distributed are chosen to limit the number of measurements involved. If a parameter of interest is not normally distributed (e.g. an EUV local CDU) it is desirable to select an underlying parameter that is normally distributed to limit the number of measurements. A normal distribution typically involves about 100 to 10,000 measurements to estimate a mean parameter and the variation to a good degree. For example, consider the measurement of CD by a CD-SEM tool. Although many parameters may contribute to accuracy, consider only the repeatability of the average CD and its variation, local CDU, classified in terms of a 3-sigma variation. Stochastic behavior presently typically has 3-sigma local CD errors ~3 nm. To obtain a 3-sigma repeatability of 0.1 nm in CD requires roughly 1000 measurements: 3/sqrt(1000)~0.1 nm. The repeatability of the local CD is 3/sqrt(2×1000). The number of measurements can typically be captured in one image, however characterizing tail-behavior would need orders-of-magnitude more (e.g. $10^9$ measurements to predict fail-rate behavior in the $10^{-6}$ range with reliability of the order of 5σ).

FIG. 7 depicts an example of process parameter (CD vs OVL) variation characterized in measurements. It is also possible to use an assumed variation, which can include a measured or known correlation between parameters, especially if simulations are to be used.

The transfer function of a yield-limiting construct is measured (e.g., its sensitivity-matrix) or simulated. This can be done on nominal parameters and using reference CD and OVL measurements during a set-get experiment. FIG. 8 depicts the transfer function between the chosen process parameters and the critical yield-limited parameter, e.g. the bottom-EPE of a via. Different metrology tools can be used for each measurement (e.g. an optical measurement tool (e.g., using UV radiation) for OVL, a scanning electron microscope type tool (SEM) for CD, a transmission electron microscope type tool (TEM) for EPE-bottom). FIG. 9 is another depiction of a relationship between EPE, overlay and CD in an exemplary device pattern. It should be noted that the measurement of the distribution of the input parameters and the transfer function can be measured in either order or in parallel.

The separate measurement of the relevant dimension that corresponds to the failure-mode makes it possible to estimate the distribution of that parameter. In practice, the measurement can be done using various techniques, for example:

TEM or X-section SEM which is often the default metrology for processing tools.
High-voltage SEM (e.g. the HMI NanoScan tool).
Profilometry (e.g. to measure deposition conformity)
Optical CD reconstruction, e.g. scatterometry.

Based on the distribution functions of the process (input) parameters and the transfer function, it is possible to calculate a multi-dimensional performance probability function that indicates the probability of success (or failure) of a process as a function of nominal values of the process parameters. For example, for 2 parameters CD and OVL, the performance probability function can be given by:

$$\text{PDF}_{EPE}\Delta\text{EPE}=\Sigma_{f(CD,OVL)=EPE}\text{PDF}_{CD,OVL}\Delta CD\ \Delta OVL \quad (3)$$

A variety of numerical methods can be used to estimate the probability density for EPE for a given joint probability function. For example, a method to predict $\text{PDF}_{EPE}$ (EPE) at value EPE is to solve the inverse equation for the underlying area between OVL, $CD=f^{-1}$ (EPE-dEPE/2) and OVL, $CD=f^{-1}$ (EPE+dEPE/2) and sum over a discretized joint probability function in that area.

The performance probability function can be estimated for different nominal parameters, for example desired values of CD, OVL, deposition thickness, etch-time, one or more CMP settings, etc. The performance probability function can be derived as a function of more than two process parameters. An advantage is that the number of measurements involved if there is a change is much reduced. For example, if a new tool or control strategy is introduced, it is only necessary to requalify the process-parameters. If a new process is introduced it is only necessary to re-measure the transfer curve. In both cases, it is not necessary to qualify complex tail-behavior and how the distribution varies throughout the process settings. Embodiments of the invention can make it possible to separately analyze the impact of the manufacturing tool process-variance and the non-linear transfer process itself.

Furthermore, various approximation methods make it possible to add a parameter and severely limit the number of measurements necessary. For example, if no correlation of the existing process parameters and any new parameter (e.g. CMP pressure) is assumed, it is possible to measure the variation of the CMP pressure for a nominal substrate set (through some indirect measurement of CD or just by recording a control residual on the CMP tool) and then perform measurements on one or more skew substrates where all other parameters are nominal and the CMP pressure is varied. For further accuracy or if there are correlations between parameters, it is possible to measure additional substrates and add the results to the original measurements.

Figure 12:
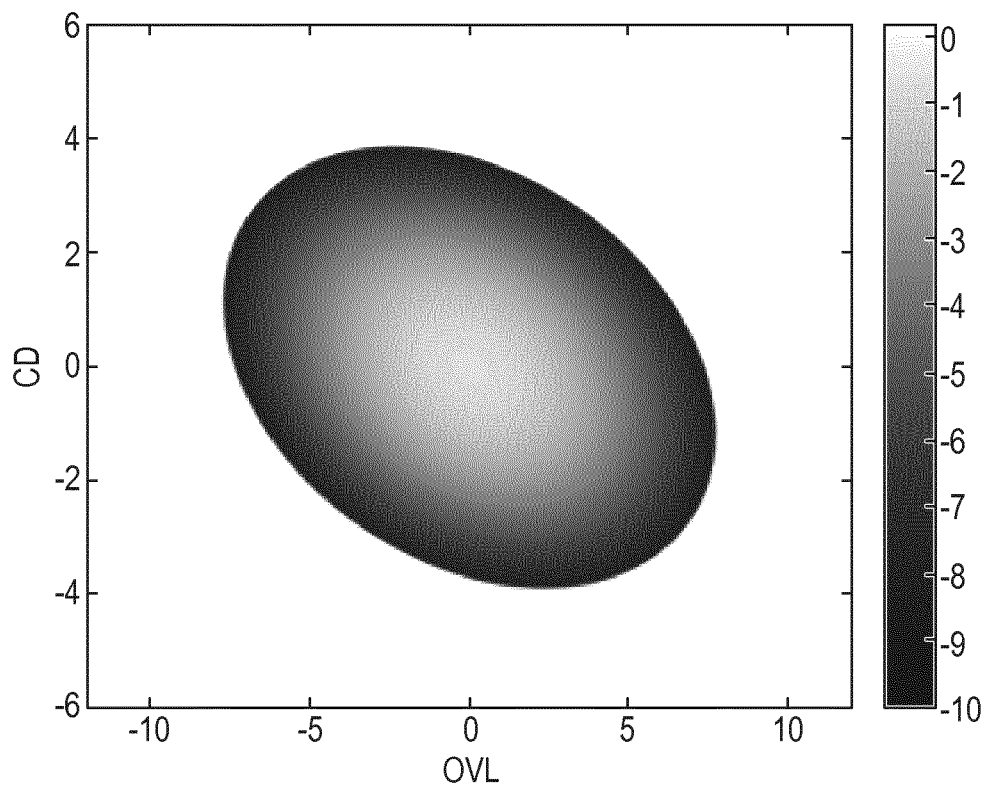
Figure 13:
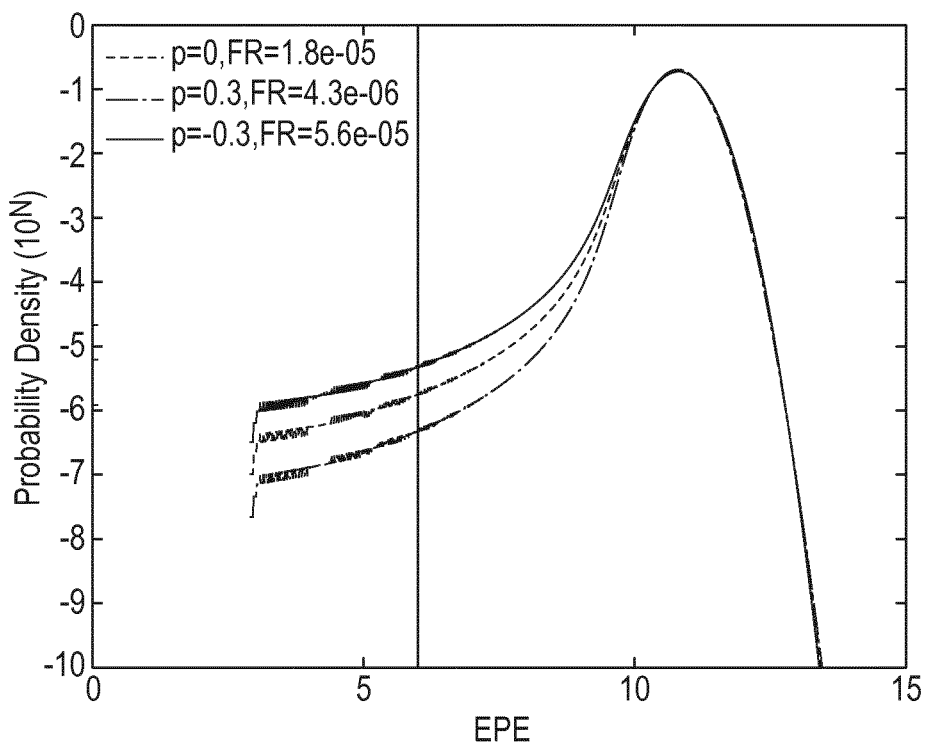
FIG. 13 is a graph showing a distribution of edge placement error for different amounts of correlation between the assumed overlay and CD distributions.
Figure 14:
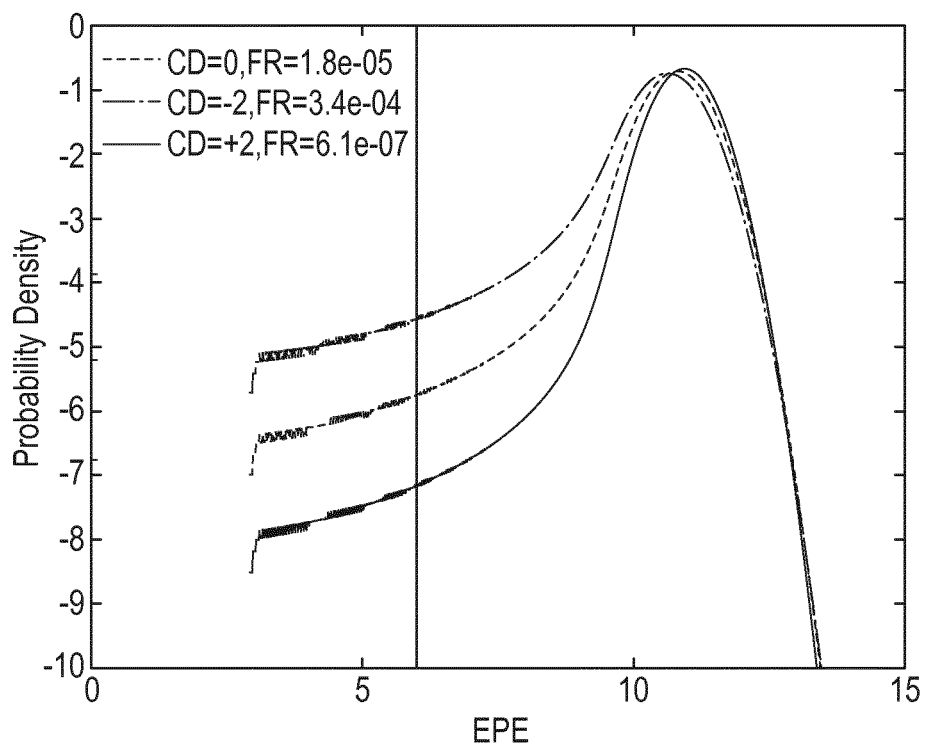
FIGS. 14 and 15 are graphs of a distribution of edge placement error for different values of mean CD and overlay respectively, wherein the predicted probability that an individual occurrence has an edge placement error<6 nm is indicated by FR ("Fail rate")
Figure 15:
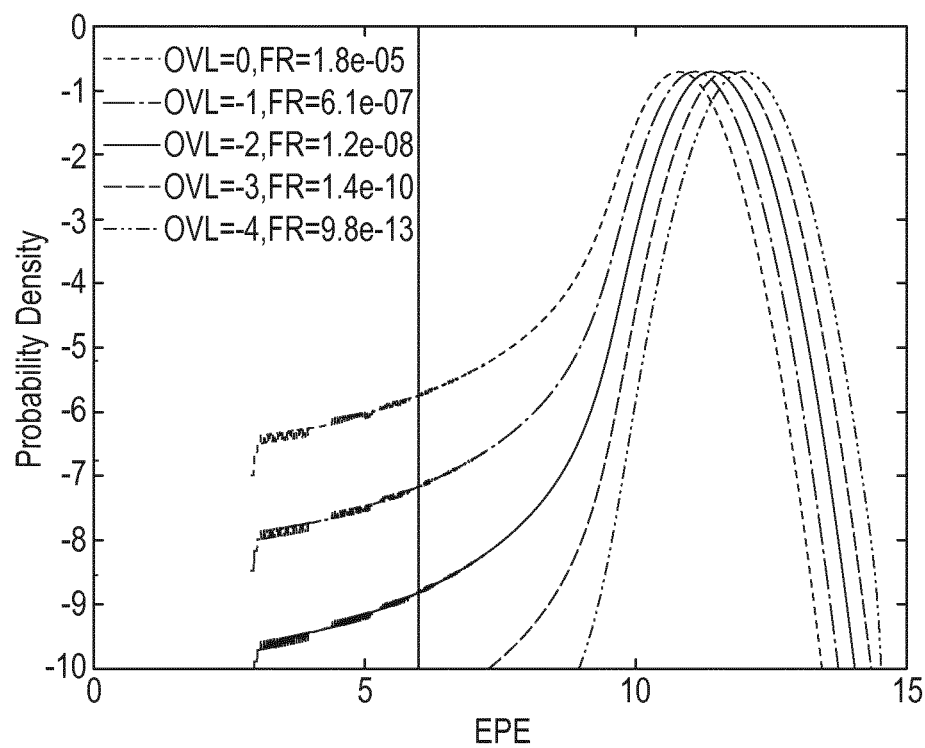
Figure 16:
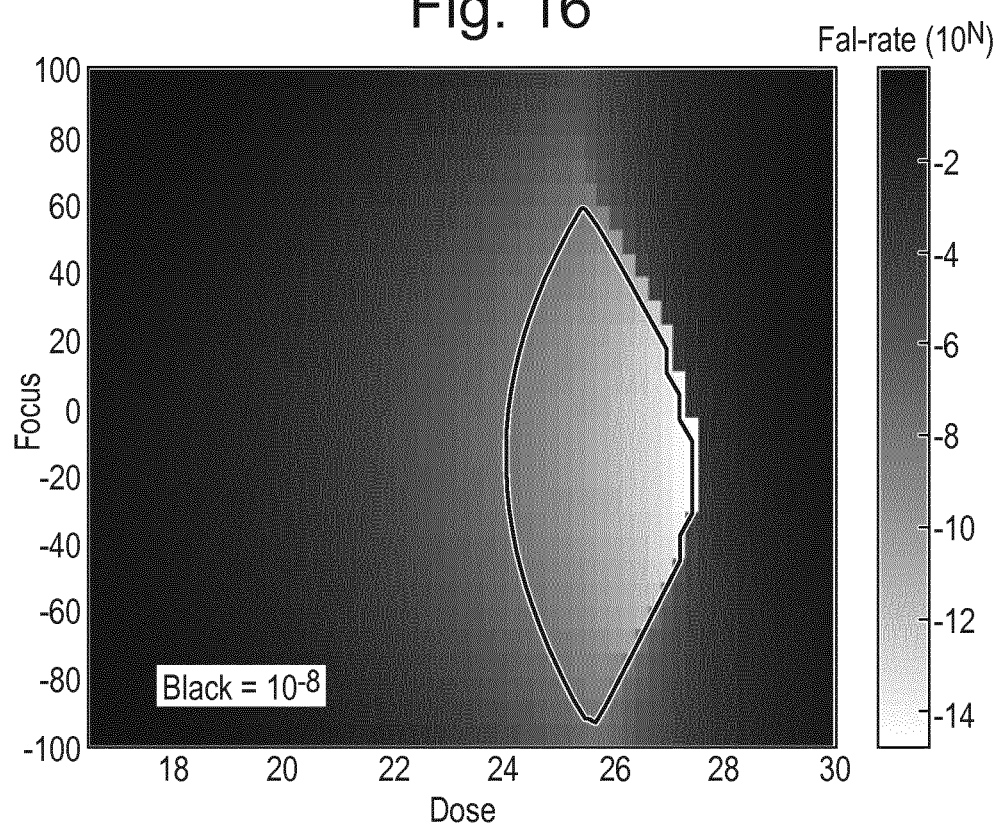
FIG. 16 is a graph of device failure rate as a function of focus and dose, indicating a viable process window.
Figure 17:
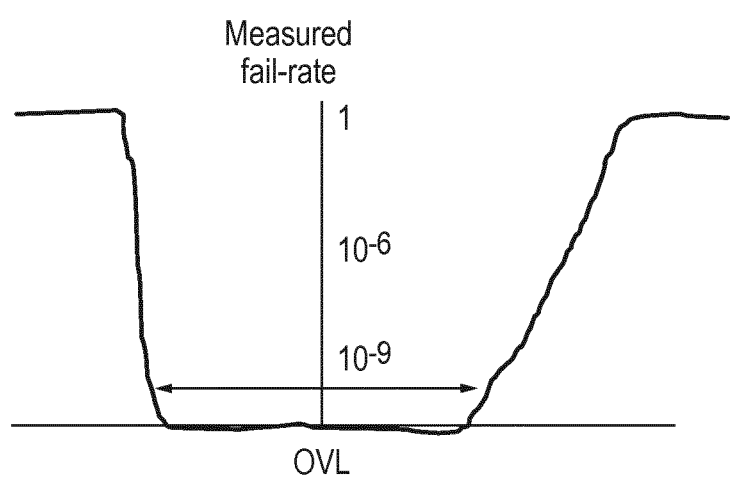
FIG. 17 is a graph showing measured device failure rates versus overlay.

The non-linearity of the transfer function and the correlation between parameters can have a substantial effect on failure rates, which the performance probability function can reveal. This is shown in FIGS. 10 to 15. FIGS. 10, 11 and 12 depict probability density functions for CD and overlay for different amounts of correlation between these two process parameters: FIG. 10 depicts the case of a small positive correlation, p=+0.3; FIG. 11 depicts the case of no correlation, p=0; and FIG. 12 depicts the case of a small negative correlation, p=−0.3. Using the transfer function depicted in FIG. 8, performance probability functions are shown for different nominal settings in FIGS. 13, 14 and 15. FIG. 13 shows the overall EPE for different correlation factors, demonstrating a difference in failure rates of about 1.5 orders of magnitude. The predicted probability that an individual occurrence has an EPE<6 nm is indicated by FR ("Fail rate"). FIG. 14 shows the performance probability function at different mean CD values, demonstrating a change in failure rates of 2 to 3 orders of magnitude with a variation of CD of ±2 nm. As in FIG. 13, the predicted probability that an individual occurrence has an EPE<6 nm is indicated by FR ("Fail rate"). FIG. 15 shows the performance probability function at different mean overlay values, demonstrating a change in failure rates of 7 orders of magnitude with different values of overlay up to 4 nm.

A particularly advantageous use of an embodiment of the invention is to derive a process window. For a given desired fail-rate, the nominal process-parameters can be searched to find an acceptable process-window. In other words, the performance probability function provides a multi-dimensional window giving values of the relevant process parameters (e.g. CD, OVL, etc.) meeting a criteria that the fail-rate is less than a target.

If it is desired, it is possible to calibrate the process window by performing test exposures at the edges of the process window and measuring the failure rates obtained. The measured failure rates are compared to expected failure rates obtained by calculating a cumulative performance probability function and obtaining the fail-rate for the ranges of the process parameters used for the test exposures. The process parameters for the test exposures can be chosen so that the expected fail-rates are sufficiently high to enable qualification of these rates with a sufficient confidence interval (e.g. $10^{-3}$) so that relatively small numbers of tests are used. The fail-rates at off-target conditions can be measured by the metrology methods mentioned above or other methods, such as:

Electrical yield-vehicles
Brightfield inspection
Voltage-contrast inspection

Such a calibration method can be useful to validate the derivation of the performance probability function and remove any potential inaccuracies in the metrology that measures a relevant parameter (e.g. EPE). The error can be an offset in a measurement tool at absolute nm scale or even a small linear correction over a reasonable range. These yield (or reliability) measurements can also be used to set a reasonable specification for EPE by solving the inverse problem. If the fail-rate at a particular EPE distribution behavior is known, it is possible to find the EPE-limit by looking up the relevant fail-rate value in the cumulative distribution function.

According to an embodiment, the performance probability function can be used in process control, e.g. during high-volume manufacture. The performance probability function characterizes the non-linear behavior of the process so that by monitoring one or more individual parameters it is possible to calculate the process-margins or control the one or more parameters to stay in or near the center of the process-window. For example, if a processed substrate is known to have a large OVL and large CD, it might be possible to compensate by using a shorter etch-time and reduce or minimize the chance of "snapping". The performance probability function provides information to determine how much the etch time should be reduced (i.e. OVL/CD process-window as a function of etch-time).

It will be seen that an embodiment of the present invention can provide a novel approach to the treatment of correlated parameters allowing for the control of process parameters.

An advantage of embodiments of the invention is that it can be used to reduce or minimize the number of simulations needed to determine a process-window. For example, the number of measurements to characterize a process reduces from $10^9$ per condition to $10^3$ per condition ($10^3$ needed to characterize measurable failure-rates and reduce noise). It becomes possible with a high-throughput SEM/TEM to screen multiple parameters in a reasonable amount of time which was otherwise practically impossible.

If known or calibrated process-models in simulation software are available, a sensitivity calculation together with estimates for the initial parameters can be used in the method described herein to create a full model that predicts probability distribution behavior and failure-rates (based on certain geometrical rules or calibrated externally). It is then possible to improve design of the processing stack and how, for example, an OVL/CD process-window depends on it.

The performance probability function can also be used to estimate the electrical performance and variance therein. For example, one can choose a larger CD for all vias in the die by tuning the dose if one has a small OVL and therefore reducing the average resistance of the vias, i.e. improve the power consumption or even adjust the expected flip-flop timing/performance.

A calibrated performance probability function can be used to define and use additional control "knobs" in lithography or other processing tools to stay in or near the center of the process window if some of the parameters have been measured for a process (the above mentioned large OVL/large CD can be compensated by limiting the etch-time to create a smaller bottom-CD).

In an embodiment, the various options for control of the lithographic process can be presented to the lithographer in a performance dashboard. Such a dashboard can present budget or target values for a process (e.g. Table 1 below) as well as actually achieved values (e.g. Table 2 below).

TABLE 1

| EPE bottom | target | (3σ-) window |
|---|---|---|
| OVL | +0.5 nm | +3 nm |
| dose | 25 mJ/cm² | +−2 mJ/cm² |
| focus | −10 nm | +−40 nm |
| HM thickness | 22 nm | +−3 nm |
| Etch-time | 10 s | +−2 s |
| Process-Capability | 99.9% | |

TABLE 2

| EPE bottom | target | (3σ-) window |
|---|---|---|
| OVL | +0.8 nm | +4 nm |
| dose | 25 mJ/cm² | +−1 mJ/cm² |
| focus | −15 nm | +−20 nm |
| HM thickness | 23 nm | +−1 nm |
| Etch-time | 9 s | +−1 s |
| Process-Capability | 99.7% | |

Desirably, a report contains at least some selected from: an optimal target for one or more or all contributors; a measured or targeted window; and/or a final process-capability (one or more targets). Actual status on a process window or an alternative budget desirably contains one or more updated targets resulting from one or more new windows and/or an updated process-capability status. A dashboard may then allow: optimizing one or more ideal process parameters (e.g. optimal thickness); trade-in one or more individual parameter-windows (e.g. etch-time/OVL-window); and/or report on the capability of a process for a given tool-set.

A further aspect of the invention aims to improve indirect control of the lithography apparatus based on multiple sensor readings and interpretation of the readings. Conventional control strategies aim to minimize the measured value of an error. For example, an overlay-based control strategy aims to minimize overlay locally or averaged over a field or substrate. However, metrology measurements on which such control is based may have a systematic error because it is measured on a target which can behave differently than product features when subjected to a pattern transfer process (e.g. etching) or device manufacturing process (e.g. CMP). Methods to measure, and to correct for, such error have been proposed but improvements are still desirable.

Figure 21:
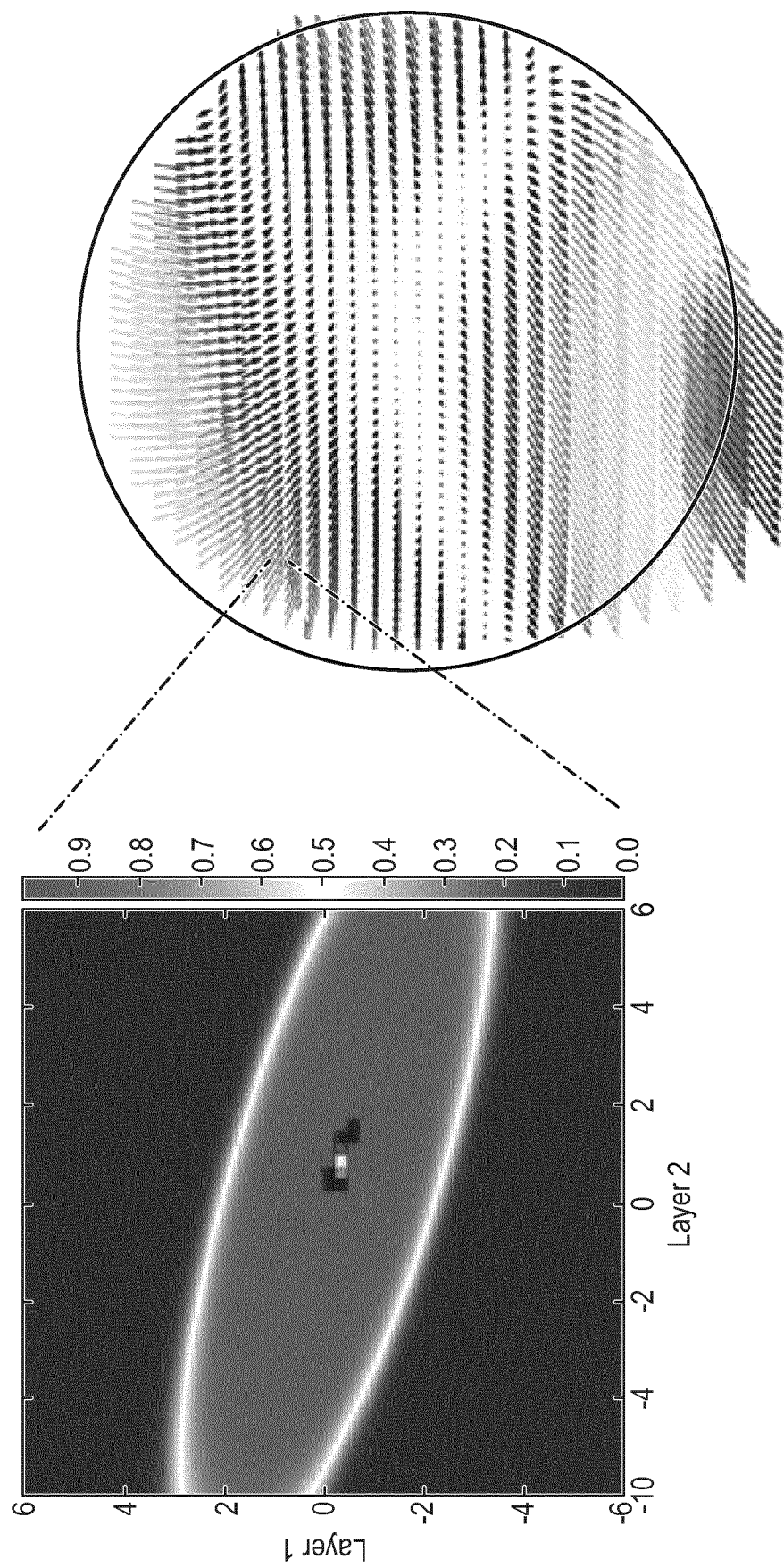
FIG. 21 is a diagram illustrating a derivation of a control window from synthetic data.

According to this aspect it is proposed to determine a process window function to be used to control the lithographic apparatus so as to improve or optimize yield rather than minimize an error measured by a metrology device. Typically, errors in the measurements vary across the substrate or a field. FIG. 21 depicts an example of measurement errors in overlay error across a substrate, the arrows indicate the direction and relative magnitude of the overlay measurement errors at different points on the substrate. FIG. 21 further shows an approach which is taken to calibrate such error. It shows how the center of a process window, that has been optimized for one position on the substrate, needs to be varied according to position on the substrate to gain improved or maximal yield. It also shows uncertainty of error of such calibration. The embodiment proposes a model to determine adjustments to be applied in the control of a lithographic process, in particular to the control center of a process window, based on an established relation between measurement error and actual yield performance.

Use of the proposed calibration method of process window adjustment according to position on the substrate in, e.g., the lithographic apparatus control will improve yield. The function uses per substrate measurements to estimate adjustment of one or more control apparatus (e.g., one or more actuators) to increase the yield:

$$\overrightarrow{a_{Yield}} = \underset{\vec{a}}{\operatorname{argmax}}\left\{\text{Yield}\begin{pmatrix} OV(WA, LVL, \text{sensor} - \sum_{i=1}^{N} a_i \vec{C}_i, \\ F(LVL, WA, \text{sensor}) - \sum_{j=1}^{M} b_j \vec{G}_j \end{pmatrix}\right\} \quad (4)$$

where $\hat{C}_i$, $\hat{G}_j$ are vectors containing the correction basis function for overlay (OV) and focus (F). In the equation above, Yield represents a calibrated process window function with a center varying with position on the substrate or field. The control method will search for corrections $\hat{C}_i$, $\hat{G}_j$; such that the yield function (in this embodiment) maximizes. Also the method will attempt to co-optimize different control scenarios such as focus vs. overlay control.

An embodiment adopts a two-step approach to derive a new control method. First, a per-substrate prediction of one or more device performance indicators (e.g. overlay/defocus) is obtained using all available sensor data including indirect measurements and calculation of adjustments of actuations.

Secondly, sensor readings (for example, reading from a lithographic apparatus sensor such as substrate alignment mark measurements) are used to generate a control function. The control function may control a variety of controllable functions of the lithographic apparatus or other tool. For example, displacement errors can be compensated by stage position adjustments during the scanning of a field. However any other available control functions can be used. Sensor readings are used with data driven training or simulation to distinguish between yield loss contributors which can and cannot be corrected by control functions of the lithographic apparatus or other tool. For example, deposition thickness variations cannot be corrected in the lithographic apparatus, but can be corrected in the deposition tool. The results of training or simulation can be used to correct a measurement signal to avoid crosstalk between errors correctable in one apparatus (e.g., the lithographic apparatus) and errors which can be corrected elsewhere (e.g. in a deposition tool).

The measurement signal can be derived from any sensor which makes a measurement of the substrate, for example a level sensor (which obtains a height map of the substrate surface), a CD measurement tool, or other measurements. In an embodiment, CD measurements are used. Desirably, a combination of CD and overlay is used to allow calculation of tradeoffs between different product printing key performance indicators (KPIs).

Knowledge of how the sensor measures the sensor target can also help the prediction. In an embodiment, the measurements are decoded. For example, an alignment sensor may use multiple wavelengths of radiation (colors) to measure the position of a single target. Color to color differences in alignment measurements taken on the same target can give indications of asymmetry error and therefore hint at metrology error. This information and reconstruction of the target enables the data model to characterize errors as correctable in the lithographic apparatus, in some other apparatus, or not correctable. It is also possible to change the measurement signal intensity to clarify errors which cannot be corrected for in, e.g., the lithographic apparatus.

A data mining approach can be used to find relationships between other sensor measurements (e.g. humidity or temperature) and yield. This approach allows to compensate for missing data in the process of calibration of the yield function as not all substrates or not all parts of the substrates will be sampled equally with metrology measurements while sensor readings can be considered as independent continuous measurements. These measurements together with data models can be used as interpolation of the direct sensor readings allowing better control.

In an embodiment, sensor measurements as described above are used to create estimates for control adjustments (e.g. substrate stage displacement) which will depend on the substrate order in a batch or position on the substrate.

Once the relationship between sensor and yield has been established, this function can be used for control or excursion detection. If one of the sensors gives a different reading, the model will help to flag the issue as whether the issue could impact yield. So, it is possible to prevent or reduce yield loss.

A model derived according to an embodiment of the invention can be used for different products produced using the same process. Adjustment and excursion control settings per product can be derived.

A further aspect of the invention aims to determine whether measurement values that have large variances (i.e. have values far from the average or at the extremes of the measurement range) are correct or not. Such measurements may be referred to as outliers. An outlier may result from an error in measurement of a correct target or a correct measurement of a target having an extreme value of the parameter being measured. It is generally not possible to tell, from the measurement alone, which situation applies. It is common practice to simply disregard outliers on the assumption that the measurement is more likely to be wrong than the parameter being measured is extreme. However, disregarding correct measurements in a control loop can have just as detrimental an effect as including incorrect measurements.

In lithography, control errors can have a persistent effect if a static or "run to run" control strategy is employed. Such control strategies use the results of a series of measurements or litho parameters such as overlay, CD and/or focus performed on one set of substrates to correct some future set of substrates. In a run to run strategy, the measurements are done with a regular frequency, while in a static strategy they are done as needed. In both cases, a single measurement can have an outsized effect—one measurement can impact dozens, hundreds, or even thousands of fields, depending on the correction strategy in use.

Thus, an embodiment of the invention aims to identify metrology measurements, e.g. overlay measurements, which are unlikely to be correct, or are likely to be correct despite being outliers. In practice, in order to identify incorrect measurements, an external reference is desirable; this embodiment uses yield.

A yield probability function (YPF), as described above, can be used to predict whether a field will pass or fail given the local overlay for this field. These failing dies can also be identified via a "dies in spec" approach, where dies with overlays larger than a yield-calibrated threshold are predicted to fail.

An embodiment of the present invention examines the fields which are predicted to fail a yield test, but in fact pass.

In particular, when a field is predicted to fail, but in fact passes, this is an indicator that overlay has locally been estimated to be larger than it is in reality. In this method, a second parameter, or combination of parameters, is searched for which is able to provide additional evidence to confirm the inclusion or exclusion of this data point. For example, if a performance indicator such as target signal intensity is high, that may suggest that the result should be included as the target is performing as expected. The largest utility of such a model occurs when a parameter is identified which is separate from the original measurement, such as using an alignment sensor performance indicator to validate the measurement of an overlay sensor measurement, where one or more candidate second parameters are selected through a search procedure. A simple one dimensional model is given as an example in FIG. 22 to illustrate the concept.

Figure 22:
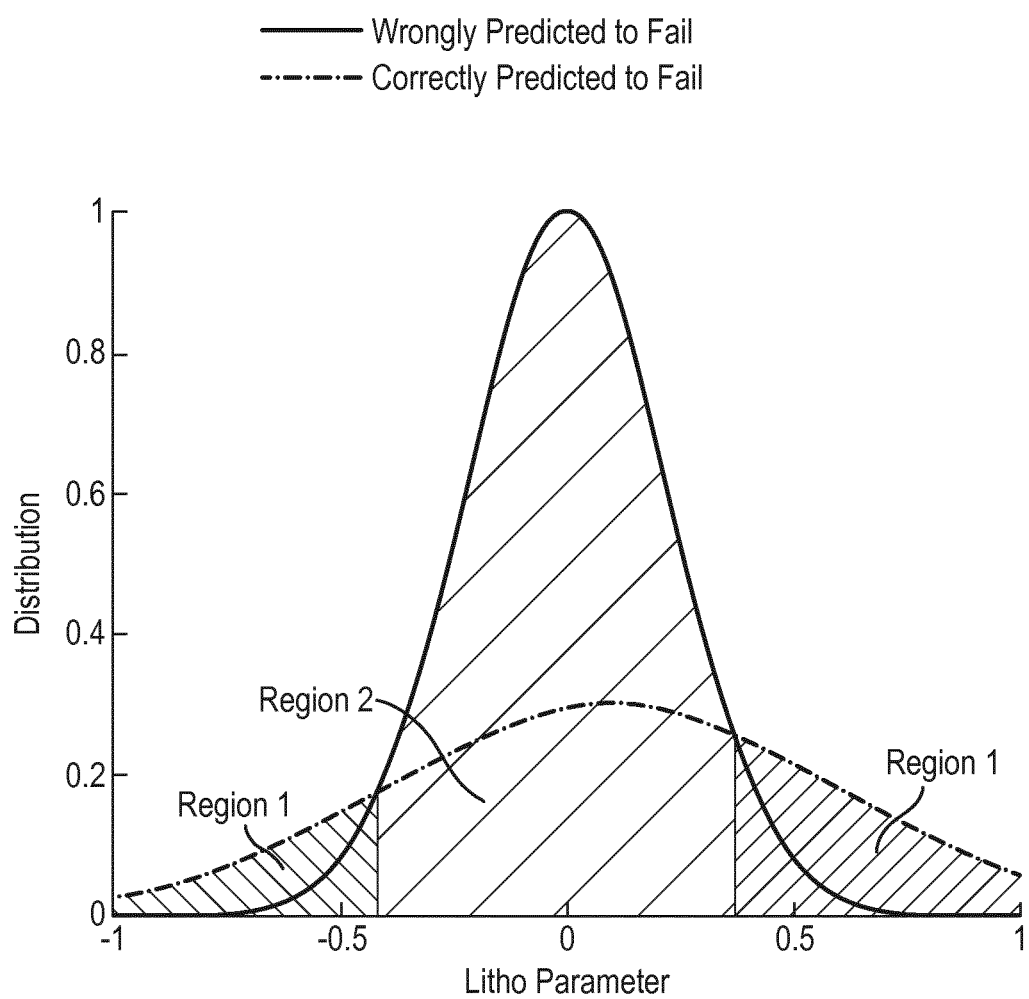
FIG. 22 is a diagram illustrating a distribution of false positive and false negative estimations of yield.

As shown in FIG. 22, for a hypothetical litho parameter, it is seen that different field populations have different distributions, depending on whether they are correctly or incorrectly classified. For dies with a litho parameter magnitude less than approximately 0.4 in the graph, the die was substantially more likely to pass than fail. Conversely, for dies with litho parameter larger than 0.5 magnitude, the die is observed to be substantially more likely to fail than pass. An embodiment of the invention uses distributions, such as shown in FIG. 22, to train a model to assess the credibility of a metrology measurement. A simple model takes an initial guess from an overlay model to identify if the die is believed to pass or not, and then looks at a secondary parameter (e.g., a litho parameter) as shown and checks if it is in region 1 or in region 2. If it is in region 1, it is more likely to be a correct measurement, whereas if it is in region 2 it is more likely to be an incorrect measurement. In the event that a measurement has been flagged as not credible, it should be excluded from control. Similarly, if it is flagged as credible, even if it is an outlier, it may be kept in the control loop.

The hypothetical parameter of FIG. 22 could be overlay, CD, focus, leveling, or some other parameter from a process tool or a metrology tool. This includes potentially combinations of such parameters, as well as one or more performance KPIs from a metrology tool (for instance color to color variation, stack sensitivity or intensity) and/or from a process tool (for instance, a temperature sensor, alignment target substrate quality or color to color variation).

An embodiment of the invention may also use a model that accounts for correlations between one or more litho parameters and overlay, or correlations across substrate positions. This includes, for example, creating a Bayesian estimate of the true overlay present on the substrate, given indications on the reliability of the overlay measurements available.

This aspect of the invention therefore provides a method for using one or more other parameters (e.g., one or more litho parameter) to assess including outlier metrology that might otherwise be excluded based on, e.g., mean-3-sigma filtering.

This aspect can provide a run to run control loop which uses a probabilistic decision making for control within a litho context, either by making probabilistic inclusion decisions, or by making weighted overlay estimates based on estimated credibility.

An embodiment of this aspect can provide more accurate metrology estimates, and hence may result in higher yield, or equal yield using fewer or faster metrology measurements. It is further possible to use information about one or more other (e.g., litho) parameters to work out whether a measurement is likely to result in useful information—if a measurement will not be believable, there is no reason to do it, for instance, resulting in decreased costs.

In an embodiment, there is provided a method for analyzing a process, the method comprising: obtaining a multi-dimensional probability density function representing an expected distribution of values for a plurality of process parameters; obtaining a performance function relating values of the process parameters to a performance metric of the process; and using the performance function to map the probability density function to a performance probability function having the process parameters as arguments.

In an embodiment, the process is a lithographic process and the process parameters are two or more process parameters selected from the group consisting of: critical dimension, focus, dose, aberration, pattern placement, pupil intensity distribution, source bandwidth, and etch time. In an embodiment, obtaining a multi-dimensional probability density function comprises measuring the process parameters on a plurality of processed substrates. In an embodiment, obtaining a multi-dimensional probability density function comprises simulating the performance of the process a plurality of times. In an embodiment, the process parameters are selected based on their distribution being a normal distribution. In an embodiment, the process parameters are at least partially correlated. In an embodiment, the performance function is non-linear. In an embodiment, the performance metric is one or more selected from: edge placement error, yield, throughput, overlay margin and/or electrical performance. In an embodiment, the method further comprises identifying process parameter values for which the performance probability function meets a criterion. In an embodiment, the method further comprises selecting a set of nominal process settings for a lithographic process that fall within the sub-space. In an embodiment, there is provided a device manufacturing method comprising: exposing a radiation-sensitive layer on a substrate to form a latent image therein; developing the radiation-sensitive layer to fix the latent image; and transferring the fixed image onto the substrate, wherein at least one selected from the exposing, developing and/or transferring steps is performed using a set of nominal process settings determined by a method as described above.

In an embodiment, there is provided a device manufacturing method comprising: exposing a radiation-sensitive layer on a substrate to form a latent image therein; developing the radiation-sensitive layer to fix the latent image as a developed image; transferring the fixed image onto the substrate to form a device feature or a measurement target; measuring a characteristic of at least one selected from the latent image, the developed image, the device feature and/or the measurement target; and using a performance probability function as described above and the measured characteristic to determine a process setting for a subsequent exposing, developing or transferring step.

In an embodiment, there is provided a computer program comprising instructions that, when executed by one or more lithography tools, instruct the lithography tool(s) to perform a method as described herein.

Further embodiments are disclosed in the list of numbered clauses below:
1. A method for analyzing a process, the method comprising:
    obtaining a multi-dimensional probability function representing an expected distribution of values for a plurality of process parameters;

obtaining a performance function relating values of the process parameters to a performance metric of the process; and using the performance function to map the probability density function to a performance probability function having the process parameters as arguments.

2. The method according to clause 1, wherein the multi-dimensional probability function is a probability density function or a yield probability function.

3. The method according to clause 1 or clause 2, wherein the process is a lithographic process and the process parameters are selected from the group consisting of: focus, dose, overlay, aberration, a parameter relating to movement of a stage of a lithographic apparatus, pupil intensity distribution, and source bandwidth.

4. The method according to any of clauses 1-3, wherein the process includes transferring a pattern to the substrate and the process parameters are selected from the group consisting of: RF power (per frequency), substrate temperature, (partial) gas pressure in a plasma, composition of a plasma, a CMP pressure, a CMP polish routine, etch time, and deposition thickness.

5. The method according to any of clauses 1-4, wherein obtaining a multi-dimensional probability function comprises measuring values of the process parameters on a plurality of processed substrates.

6. The method according to any of clauses 1-5, wherein obtaining a multi-dimensional probability function comprises simulating the performance of the process a plurality of times.

7. The method according to any of clauses 1-6, wherein obtaining a multi-dimensional probability function comprises training a machine learning algorithm.

8. The method according to any of clauses 1-7, wherein the process parameters have a normal distribution.

9. The method according to any one of clauses 1-8, wherein the process parameters are at least partially correlated.

10. The method according to any of clauses 1-9, wherein the performance function is non-linear.

11. The method according to any of clauses 1-10, wherein the performance metric is selected from the group consisting of: edge placement error, critical dimension, and critical dimension uniformity.

12. The method according to any of clauses 1-11, further comprising identifying a sub-space of process parameter values for which the performance probability function meets a criterion.

13. The method according to clause 12, further comprising calibrating the process window by performing test exposures at an edge of the sub-space and measuring the failure rates obtained.

14. The method according to clause 12 or clause 13, further comprising selecting a set of nominal process settings for a lithographic process that fall within the sub-space.

15. The method according to any of clauses 1-14, further comprising analyzing the performance probability function to determine changes to the performance function and/or the probability density function that would improve yield.

16. A device manufacturing method comprising:
exposing a radiation-sensitive layer on a substrate to form a latent image therein;
developing the radiation-sensitive layer to fix the latent image; and
transferring the fixed image onto the substrate, wherein at least one selected from the exposing, developing and/or transferring steps is performed using a set of nominal process settings determined by the method of clause 14.

17. A device manufacturing method comprising:
exposing a radiation-sensitive layer on a substrate to form a latent image therein;
developing the radiation-sensitive layer to fix the latent image as a developed image;
transferring the fixed image onto the substrate to form a device feature or a measurement target;
measuring a characteristic of at least one of selected from the latent image, the developed image, the device feature and/or the measurement target; and
using a performance probability function determined according to any of clauses 1 to 15 and the measured characteristic to determine a process setting for a subsequent exposing, developing or transferring step.

18. A method of assessing a field of a substrate that has been patterned using a lithographic process, the method comprising:
measuring a first lithographic parameter of a field to obtain a measurement value;
obtaining an estimate of the probability of the field having been correctly patterned using the measurement value of the first lithographic parameter; and
determining the credibility of the estimate on the basis of a second lithographic parameter that is different than the first lithographic parameter.

19. The method according to clause 18, further comprising controlling a lithographic apparatus, a process step or a process tool on the basis of the measurement value only responsive to the estimate being determined to be credible.

20. The method according to clause 18, further comprising controlling a lithographic apparatus, a process step or a process tool on the basis of a weighted value of the measurement value only responsive to the estimate being determined to be credible.

21. A computer program comprising instructions that, when executed by one or more computers and/or one or more process tools, instruct the one or more computers and/or one or more process tools to perform the method of any of clauses 1-20.

22. A method for analyzing a process, the method comprising: obtaining a multi-dimensional probability density function representing an expected distribution of values of a plurality of process parameters; obtaining a performance function relating values of the process parameters to a performance metric of the process; and using the performance function to map the multi-dimensional probability density function to a performance probability function having the process parameters as arguments.

23. The method according to clause 22, further comprising identifying one or more ranges of the process parameters for which the performance probability function meets a criterion.

24. The method according to clause 23, further comprising calibrating a process window associated with the process parameters by performing exposures at one or more edges of the one or more ranges of the process parameters and measuring failure rates associated with features formed as a result of performed exposures.

25. The method according to clause 23, further comprising selecting a process setting for a lithographic process based on the one or more identified ranges of the process parameters.

26. The method of clause 22, wherein the step of obtaining a multi-dimensional probability density function is preceded by a step of selecting the process parameters based on a characteristic of an expected statistical distribution of their values.

27. The method of clause 26, wherein the characteristic is an expected similarity to a normal distribution.

Although specific reference may be made in this text to the use of metrology apparatus in the manufacture of ICs, it should be understood that the apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference is made in this text to "metrology apparatus" or "inspection apparatus", both terms may also refer to an inspection apparatus or an inspection system. For example, the inspection or metrology apparatus that comprises an embodiment of the invention may be used to determine characteristics of structures on a substrate (e.g., a wafer). For example, the inspection apparatus or metrology apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may be made in this text to embodiments of the invention in the context of a metrology apparatus, embodiments of the invention may be used in other apparatus. Embodiments of the invention may form part of a patterning device (e.g., mask) inspection apparatus, a lithographic apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that an embodiment of the invention, where the context allows, is not limited to optical lithography and may be used in other applications, for example imprint lithography.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
    obtaining a multi-dimensional probability density function representing an expected distribution of values of a plurality of process parameters of a manufacturing process;
    obtaining a performance function relating values of the process parameters to a performance metric of the process;
    using, by a hardware computer, the performance function to map the multi-dimensional probability density function to a performance probability function having the process parameters as arguments; and
    physically controlling or configuring the manufacturing process based on the performance probability function and/or providing a signal representing, or based on, the performance probability function to a tool or system for use by the tool or system to enable control or configuration of the manufacturing process.

2. The method according to claim 1, wherein the process is a lithographic process and the process parameters include one or more selected from: focus, dose, overlay, optical aberration, a parameter relating to movement of a stage of a lithographic apparatus, pupil intensity distribution, and/or source bandwidth.

3. The method according to claim 1, wherein the process includes transferring a pattern to the substrate and the process parameters include one or more selected from: RF power (per frequency), substrate temperature, (partial) gas pressure in a plasma, composition of a plasma, a CMP pressure, a CMP polish routine, etch time, and/or deposition thickness.

4. The method according to claim 1, wherein obtaining a multi-dimensional probability density function comprises measuring values of the process parameters on a plurality of processed substrates or simulating the performance of the process a plurality of times.

5. The method according to claim 1, wherein obtaining a multi-dimensional probability density function comprises training a machine learning algorithm.

6. The method according to claim 1, wherein the process parameters have a normal distribution and/or are at least partially correlated.

7. The method according to claim 1, wherein the performance function is non-linear.

8. The method according to claim 1, wherein the performance metric is selected from: edge placement error, critical dimension, and/or critical dimension uniformity.

9. The method according to claim 1, further comprising identifying one or more ranges of the process parameters for which the performance probability function meets a criterion.

10. The method according to claim 9, further comprising calibrating a process window associated with the process parameters by performing exposures at one or more edges of the one or more ranges of the process parameters and measuring failure rates associated with one or more features formed as a result of the exposures.

11. The method according to claim 9, further comprising selecting a process setting based on the one or more identified ranges of the process parameters.

12. The method according to claim 1, further comprising analyzing the performance probability function to determine changes to the performance function and/or the multi-dimensional probability density function that would improve yield.

13. The method of claim 1, wherein the obtaining a multi-dimensional probability density function is preceded by selecting the process parameters based on a characteristic of an expected statistical distribution of their values.

14. The method of claim 13, wherein the characteristic is an expected similarity to a normal distribution.

15. A computer program product comprising a non-transitory computer-readable medium having instructions therein, the instructions, when executed by one or more computers, configured to cause the one or more computers to at least:
obtain a multi-dimensional probability density function representing an expected distribution of values of a plurality of process parameters of a manufacturing process;
obtain a performance function relating values of the process parameters to a performance metric of the process;
use the performance function to map the multi-dimensional probability density function to a performance probability function having the process parameters as arguments; and
cause physical control or configuration of the manufacturing process based on the performance probability function and/or provide a signal representing, or based on, the performance probability function to a tool or system for use by the tool or system to enable control or configuration of the manufacturing process.

16. The computer program product according to claim 15, wherein the instructions configured to obtain a multi-dimensional probability density function are further configured to obtain measured values of the process parameters on a plurality of processed substrates or simulate the performance of the process a plurality of times.

17. The computer program product according to claim 15, wherein the instructions are further configured to cause the one or more computers to identify one or more ranges of the process parameters for which the performance probability function meets a criterion.

18. The computer program product according to claim 17, wherein the instructions are further configured to cause the one or more computers to select a process setting based on the one or more identified ranges of the process parameters.

19. The computer program product according to claim 15, wherein the instructions are further configured to cause the one or more computers to analyze the performance probability function to determine a change to the performance function and/or the multi-dimensional probability density function that would improve yield.

20. The computer program product according to claim 15, wherein the instructions are further configured to cause the one or more computers to select the process parameters based on a characteristic of an expected statistical distribution of their values preceding to obtaining of a multi-dimensional probability density function.

* * * * *